US012666951B2

(12) United States Patent
Ahn et al.

(10) Patent No.: US 12,666,951 B2
(45) Date of Patent: Jun. 23, 2026

(54) SEMICONDUCTOR DEVICE

(71) Applicant: Samsung Electronics Co., Ltd., Suwon-si (KR)

(72) Inventors: Junhyeok Ahn, Suwon-si (KR); Jinkuk Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 497 days.

(21) Appl. No.: 18/201,995

(22) Filed: May 25, 2023

(65) Prior Publication Data

US 2023/0387005 A1 Nov. 30, 2023

(30) Foreign Application Priority Data

May 30, 2022 (KR) ........................ 10-2022-0065843

(51) Int. Cl.
*H10W 20/43* (2026.01)
*H10W 20/00* (2026.01)
(Continued)

(52) U.S. Cl.
CPC ......... *H10W 20/43* (2026.01); *H10W 20/056* (2026.01); *H10W 20/072* (2026.01);
(Continued)

(58) Field of Classification Search
CPC ............... H01L 23/528; H01L 21/7682; H01L 21/76832; H01L 21/76877; H01L 23/53266; H01L 21/76843; H01L 21/76865; H01L 23/5222; H01L 23/53242; H01L 21/76885; H01L 23/53252;
(Continued)

(56) References Cited

U.S. PATENT DOCUMENTS 9,257,289 B2 2/2016 Leobandung et al.
9,589,836 B1 * 3/2017 Zhang ................... H01L 23/528
(Continued)

FOREIGN PATENT DOCUMENTS

KR 10-2018-0101226 A 9/2018
KR 10-2020-0029856 A 3/2020

OTHER PUBLICATIONS

Communication issued on Nov. 27, 2025 by the Korean Intellectual Property Office in Korean Patent Application No. 10-2022-0065843.

*Primary Examiner* — Patricia D Valenzuela
(74) *Attorney, Agent, or Firm* — Sughrue Mion, PLLC

(57) ABSTRACT

A semiconductor device includes a first contact structure connected to the lower structure, a first conductive wiring connected to the first contact structure, a first etch-stop layer and an interlayer insulating layer sequentially provided on the first conductive wiring, a second contact structure passing through the first etch-stop layer, provided in the interlayer insulating layer, and connected to the first conductive wiring, a second conductive wiring provided on the second contact structure and provided in the interlayer insulating layer, a barrier layer including a first barrier portion on a bottom surface of the second contact structure, a second etch-stop layer provided on a top surface of the second conductive wiring and a top surface of the interlayer insulating layer, and an air gap between the barrier layer and the extension portion.

20 Claims, 23 Drawing Sheets

(51) Int. Cl.
    *H10W 20/41*     (2026.01)
    *H10W 20/46*     (2026.01)

(52) U.S. Cl.
    CPC ....... *H10W 20/075* (2026.01); *H10W 20/425*
              (2026.01); *H10W 20/46* (2026.01)

(58) Field of Classification Search
    CPC ......... H01L 23/53295; H01L 21/76834; H01L
              23/5283; H01L 2221/1042; H10B 12/30;
              H10W 20/43; H10W 20/056; H10W
              20/072; H10W 20/075; H10W 20/425;
              H10W 20/46; H10W 20/0633; H10W
              20/063; H10W 20/47; H10W 20/033;
              H10W 20/054; H10W 20/4432; H10W
              20/495; H10W 20/077; H10W 20/435
    See application file for complete search history.

(56)                References Cited

U.S. PATENT DOCUMENTS

| | | | |
|---|---|---|---|
| 10,629,433 | B2 | 4/2020 | Ishizaka |
| 10,916,503 | B2 | 2/2021 | Yang |
| 11,239,165 | B2 | 2/2022 | Xie et al. |
| 2017/0271512 | A1 | 9/2017 | Adusumilli et al. |
| 2021/0028115 | A1* | 1/2021 | Bao .................. H01L 23/53266 |
| 2021/0202309 | A1 | 7/2021 | Tsai et al. |

* cited by examiner

'B'

BM1

63
BM1

64 { 63
61
BM0

57

63 BM1

'B'

'B'

SEMICONDUCTOR DEVICE

CROSS-REFERENCE TO RELATED APPLICATION(S)

This application is based on and claims priority to Korean Patent Application No. 10-2022-0065843 filed on May 30, 2022 in the Korean Intellectual Property Office, the disclosure of which is incorporated herein by reference in its entirety.

BACKGROUND

1. Field

One or more example embodiments relate to a semiconductor device.

2. Description of Related Art

Recently, the sizes of components of a semiconductor device have been reduced in accordance with the trend for a high degree of integration of the semiconductor device. Accordingly, the sizes of wirings electrically connected to a transistor having a reduced size have been reduced.

A wiring structure of the related art includes a conductive wiring formed of copper (Cu), and a barrier layer surrounding a surface of the conductive wiring to prevent diffusion of copper. However, the wiring structure may have a limitation with fine scaling in that the barrier layer is necessarily included, and an issue such as an increase in resistance of the conductive wiring. In addition, the conductive wiring formed of copper (Cu) may need to be planarized through chemical mechanical polishing in a manufacturing process, and thus may have high etching loss.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided is a semiconductor device having improved electrical properties.

Additional aspects will be set forth in part in the description which follows and, in part, will be apparent from the description, or may be learned by practice of the presented embodiments.

According to an aspect of an example embodiment, a semiconductor device may include a first contact structure connected to the lower structure, a first conductive wiring connected to the first contact structure, a first etch-stop layer and an interlayer insulating layer sequentially provided on the first conductive wiring, a second contact structure passing through the first etch-stop layer, provided in the interlayer insulating layer, and connected to the first conductive wiring, a second conductive wiring provided on the second contact structure and provided in the interlayer insulating layer, a barrier layer including a first barrier portion provided on a bottom surface of the second contact structure, a second etch-stop layer on a top surface of the second conductive wiring and a top surface of the interlayer insulating layer, the second etch-stop layer including an extension portion extending between the second conductive wiring and the interlayer insulating layer such that the extension portion is provided on an upper portion of a side surface of the second conductive wiring, and an air gap between the barrier layer and the extension portion.

According to an aspect of an example embodiment, a semiconductor device may include a first conductive wiring, a contact structure connected to the first conductive wiring, the contact structure including at least one of ruthenium (Ru) or molybdenum (Mo), a second conductive wiring connected to the contact structure, the second conductive wiring including at least one of ruthenium (Ru) or molybdenum (Mo), an interlayer insulating layer surrounding a side surface of the contact structure and a side surface of the second conductive wiring, a barrier layer including a first barrier portion provided between a bottom surface of the contact structure and a top surface of the first conductive wiring, and a second barrier portion provided between a side surface of the contact structure and the interlayer insulating layer, an etch-stop layer provided on a top surface of the interlayer insulating layer and a top surface of the second conductive wiring, the etch-stop layer including an extension portion provided between the side surface of the second conductive wiring and the interlayer insulating layer, and an air gap between the second barrier portion of the barrier layer and the extension portion of the etch-stop layer.

According to an aspect of an example embodiment, a semiconductor device may include a lower structure, a contact structure connected to the lower structure, the contact structure including a lower portion including a first side surface having a first inclination, and an upper portion including a second side surface having a second inclination different from the first inclination, a conductive wiring provided on the contact structure and having a structure integrated with the contact structure, the conductive wiring including a third side surface aligned with the second side surface of the contact structure and having a third inclination that is the same as the second inclination, and a barrier layer provided on at least the first side surface of the lower portion of the contact structure.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Hereinafter, example embodiments will be described with reference to the accompanying drawings.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

A semiconductor device according to example embodiments will be described with reference to FIGS. 1 to 3.

Figure 1:
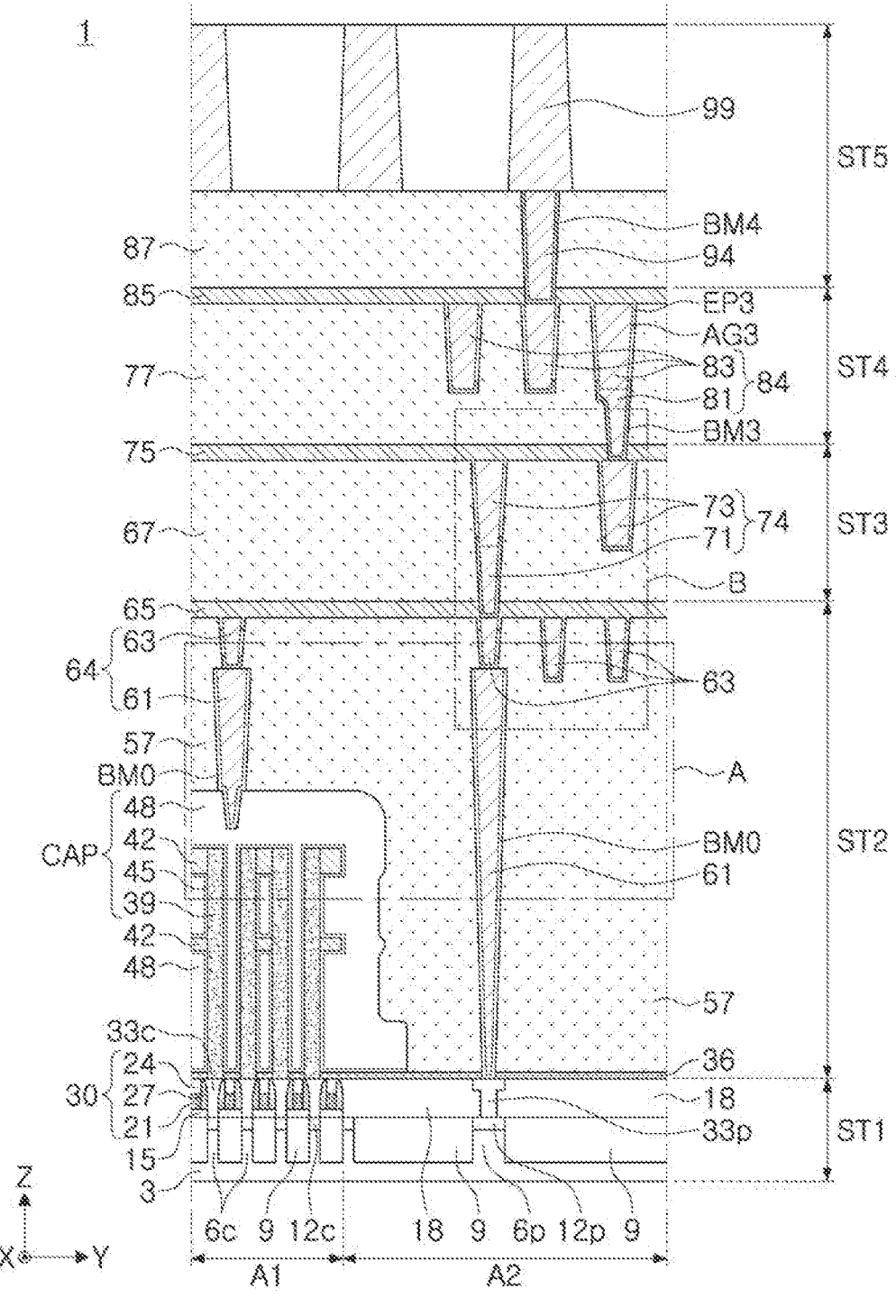
FIG. 1 is a cross-sectional view of a semiconductor device according to example embodiments.

FIG. 1 is a cross-sectional view of a semiconductor device 1 according to example embodiments. FIG. 2 is a cross-sectional view of a semiconductor device according to example embodiments. FIG. 3 is a cross-sectional view of a semiconductor device according to example embodiments. FIGS. 2 and 3 are enlarged views of the semiconductor device 1 of FIG. 1. FIGS. 2 and 3 are enlarged views of regions "A" and "B" of FIG. 1, respectively.

Referring to FIG. 1, the semiconductor device 1 may include a first structure ST1, a second structure ST2, a third structure ST3, a fourth structure ST4, and a fifth structure ST5 sequentially stacked from below.

The first structure ST1 may include a substrate 3 and an isolation region 9 defining active regions 6c and 6p on the substrate 3. The substrate 3 may be a semiconductor substrate, and may include a first region A1 and a second region A2. In example embodiments, the first region A1 may be a memory cell array region of a memory device such as a dynamic random access memory (DRAM), and the second region A2 may be a peripheral circuit region around the first region A1, which may be a memory cell array region.

The isolation region 9 defining the cell active regions 6c and the peripheral active region 6p may be disposed on the substrate 3. First impurity regions 12c may be disposed in the cell active regions 6c. The first impurity regions 12c may be a source/drain of a cell switching device disposed in the first region A1. A second impurity region 12p may be disposed in the peripheral active region 6p. The second impurity region 12p may be a source/drain of a peripheral transistor disposed in the second region A2.

The first structure ST1 may further include a first lower insulating layer 15 disposed on the first region A1 of the substrate 3, bit line structures 30 disposed on the first lower insulating layer 15, and cell contact plugs 33c disposed between the bit line structures 30.

Each of the bit line structures 30 may include bit lines 21, bit line capping layers 24 disposed on the bit lines 21, and bit line spacers 27 disposed on side surfaces of the bit lines and the bit line capping layers 24. The bit lines 21 may be formed of a conductive material. The bit line capping layers 24 may be formed of an insulating material such as silicon nitride or the like. The bit line spacers 27 may be formed of an insulating material such as silicon nitride.

The cell contact plugs 33c may be disposed between the bit line structures 30, and may be electrically connected to cell impurity regions 12c in the cell active regions 6c.

Although not illustrated in FIG. 1, the first structure ST1 may further include gate structures. In example embodiments, the gate structures may be buried in the substrate 3 to extend in a direction, intersecting the bit line structures 30. The gate structure may include a gate electrode layer, a gate dielectric film, and a gate capping layer. The gate electrode layer may be provided in a line shape extending in a direction to form a word line. The word line may be disposed to extend in a direction across the cell active regions 6c. For example, a pair of word lines adjacent to each other may be disposed to cross one cell active region.

The gate electrode layer may be formed of a conductive material such as at least one of polycrystalline silicon (Si), titanium (Ti), titanium nitride (TiN), tantalum (Ta), tantalum nitride (TaN), tungsten (W), tungsten nitride (WN), and aluminum (Al). In example embodiments, a top surface of the gate electrode layer may be positioned on a level lower than that of a top surface of the substrate 3. For example, the gate electrode layer may form a gate of a buried channel array transistor (BCAT), but example embodiments are not limited thereto. In some example embodiments, the gate electrode layer may be disposed on the substrate 3.

The gate dielectric film may cover a side surface and a bottom surface of the gate electrode layer. The gate dielectric layer may include at least one of silicon oxide, silicon nitride, and silicon oxynitride.

The gate capping layer may be disposed on an upper portion of the gate electrode layer. The gate capping layer may include an insulating material, for example, silicon nitride.

The first structure ST1 may further include a second lower insulating layer 18 disposed on the second region A2 of the substrate 3, and a peripheral contact plug 33p passing through the second lower insulating layer 18.

The second lower insulating layer 18 may cover side surfaces of the bit line spacers 27 of the bit line structures 30 adjacent to the second region A2 of the substrate 3. The peripheral contact plug 33p may pass through the second lower insulating layer 18, and may be electrically connected to a peripheral impurity region 12p in the peripheral active region 6p. Top surfaces of the bit line structures 30, the cell contact plugs 33c, the second lower insulating layer 18, and the peripheral contact plug 33p may be substantially coplanar with each other.

The second structure ST2 may be disposed on the first structure ST1. The second structure ST2 may include a data storage structure CAP. The data storage structure CAP may include conductive patterns 39, support patterns 42, a dielectric layer 45, and an electrode layer 48.

The conductive patterns 39 may include a conductive material such as a metal, a metal nitride, a metal oxide, a metal silicide, conductive carbon, or a combination thereof. For example, the conductive patterns 39 may include Ti, TiN, TiAlN, TiCN, Ta, TaN, TaAlN, TaCN, Ru, Pt, or a combination thereof. In example embodiments, each of the conductive patterns 39 may have a pillar shape extending in a direction, perpendicular to the top surface of the substrate 3. However, the shape of the conductive patterns 39 is not limited thereto, and may have, for example, a cylindrical shape, a planar shape, or the like.

The support patterns 42 may be disposed on side surfaces of the conductive patterns 39 to connect the adjacent conductive patterns 39 to each other. The support patterns 42 may prevent a defect such as the collapse or deformation of the pillar-shaped conductive patterns 39.

The dielectric layer 45 may be conformally disposed along surfaces of the conductive patterns 39 and the support patterns 42. The dielectric layer 45 may include a high-K dielectric, silicon oxide, silicon nitride, silicon oxynitride, or a combination thereof.

The electrode layer 48 may fill between the conductive patterns 39 on the dielectric layer 45, and may cover the conductive patterns 39 and the supporting patterns 42. The electrode layer 48 may include a conductive material such as a metal, a metal nitride, conductive carbon, a conductive semiconductor alloy, or a combination thereof. The semiconductor alloy may include a doped silicon-germanium (SiGe) material.

The data storage structure CAP may be a DRAM cell capacitor capable of storing information in a memory cell array such as a DRAM. For example, the conductive patterns 39 may be lower electrodes or storage nodes of DRAM cell capacitors, and the electrode layer 48 may be upper electrodes or plate electrodes of the DRAM cell capacitors. The second structure ST2 may further include a lower etch-stop layer 36 disposed below the data storage structure CAP.

A structure including the data storage structure CAP of the first structure ST1 and the second structure ST2 may be referred to as a "lower structure" herein.

The second structure ST2 may further include a first interlayer insulating layer 57, first contact structures 61 passing through the first interlayer insulating layer 57, first conductive wirings 63 connected to the first contact structures 61, and a first etch-stop layer 65. The first conductive wiring may be referred to as a "first interconnection line". The first contact structure may be referred to as a "first contact plug" or a "first single plug".

The first interlayer insulating layer 57 may be disposed on the first structure ST1 to cover the data storage structure CAP and the lower etch-stop layer 36.

The first contact structures 61 may be disposed to pass through the first interlayer insulating layer 57. Portions of the first contact structures 61 may be disposed on the first region A1 of the substrate 3, and portions of the first contact structures 61 may be disposed on the second region A2 of the substrate 3. The first contact structure 61 disposed on the first region A1 of the substrate 3 may be electrically connected to the data storage structure CAP. The first contact structure 61 disposed on the second region A2 of the substrate 3 may pass through the first interlayer insulating layer 57 and the lower etch-stop layer 36, and may be electrically connected to the peripheral contact plug 33p.

Figure 2:
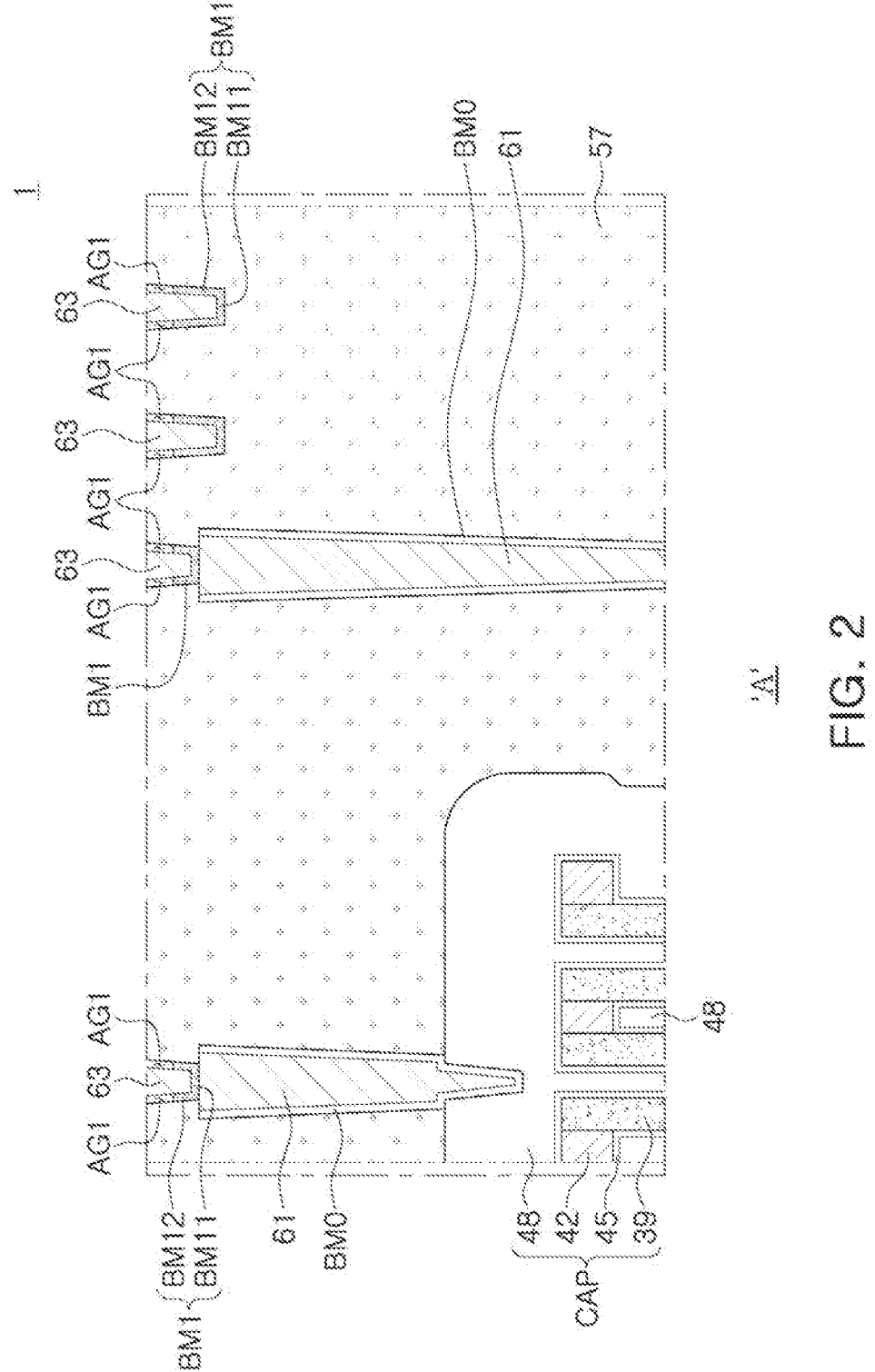
FIG. 2 is a cross-sectional view of a semiconductor device according to example embodiments.
Figure 3:
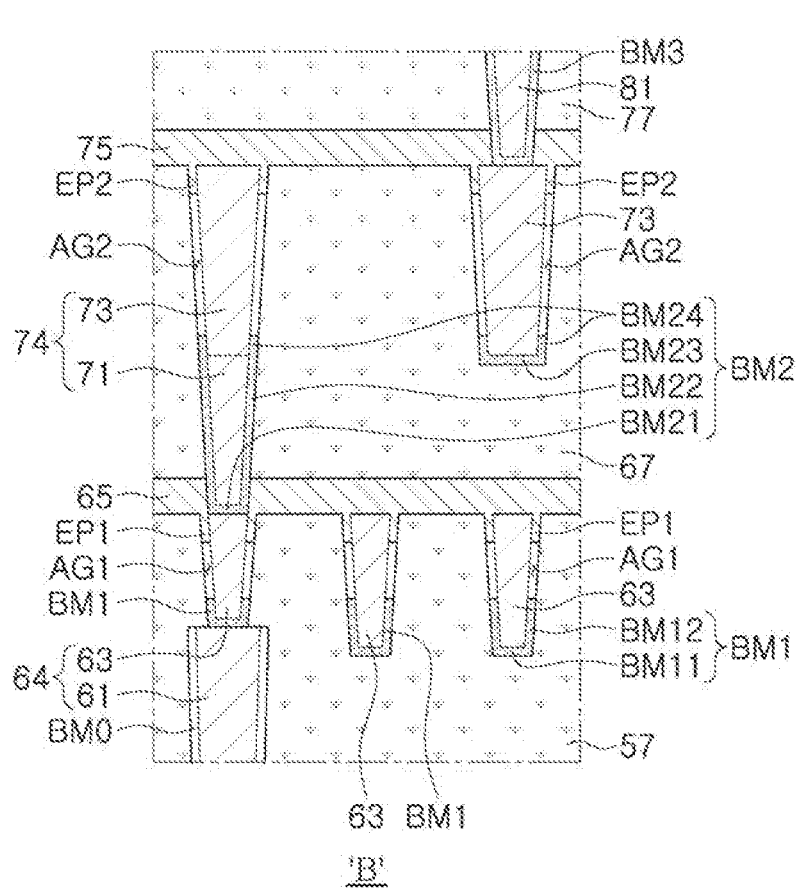
FIG. 3 is a cross-sectional view of a semiconductor device according to example embodiments.

Referring to FIGS. 1 to 3 together, the second structure ST2 may further include a contact bather layer BM0. The contact bather layer BM0 may surround a side surface and a bottom surface of the first contact structure 61. In example embodiments, the first contact structure 61 may include at least one of aluminum (Al), copper (Cu), and tungsten (W), and the contact barrier layer BM0 may include at least one of titanium (Ti), tantalum (Ta), cobalt (Co), titanium nitride (TiN), and tantalum nitride (TaN). However, the structures and material types of the first contact structures 61 and the contact barrier layer BM0 are not limited thereto, which will be described in detail with reference to FIG. 9 to be described below.

The first conductive wirings 63 may be electrically connected to the first contact structures 61, respectively. Bottom surfaces of the first conductive wirings 63 may vertically overlap top surfaces of the first contact structures 61. The first conductive wirings 63 and the first contact structures 61 may form the first conductive structure 64.

Referring to FIGS. 1 to 3 together, the second structure ST2 may further include a first barrier layer BM1. Portions of bottom surfaces and side surfaces of the first conductive wirings 63 may be surrounded by the first barrier layer BM1. For example, the first barrier layer BM1 may include a first barrier portion BM11 interposed between a top surface of the first contact structure 61 and the bottom surfaces of the first conductive wirings 63, and a second barrier portion BM12 extending from the barrier portion BM11 along portions of the side surfaces of the first conductive wirings 63. The second barrier portion BM12 may include a portion interposed between the side surfaces of the first conductive wirings 63 and the first interlayer insulating layer 57.

The first etch-stop layer 65 may cover top surfaces of the first interlayer insulating layer 57 and the first conductive wirings 63. The first etch-stop layer 65 may include first extension portions EP1 extending between the side surfaces of the first conductive wirings 63 and the first interlayer insulating layer 57. The first extension portions EP1 may extend from the first etch-stop layer 65, and may be integrally formed with the first etch-stop layer 65. The first extension portions EP1 may surround the portions of the side surfaces of the first conductive wirings 63.

Referring to FIGS. 1 to 3 together, the second structure ST2 may further include a first air gap AG1. The first air gap AG1 may be interposed between the second barrier portion BM12 of the first barrier layer BM1 and the first extension portions EP1 of the first etch-stop layer 65. The first air gap AG1 may be defined by the second barrier portion BM12 of the first barrier layer BM1, the first extension portions EP1 of the first etch-stop layer 65, the first conductive wirings 63, and the first interlayer insulating layer 57. The first air gap AG1 may surround the portions of the side surfaces of the first conductive wirings 63. The semiconductor device 1 may include the first air gap AG1 to reduce resistance and parasitic capacitance between the first conductive wirings 63.

The third structure ST3 may include a second interlayer insulating layer 67, a second conductive structure 74 passing through the second interlayer insulating layer 67, and a second etch-stop layer 75.

The second interlayer insulating layer 67 may be disposed on the second structure ST2 to cover the first etch-stop layer 65. The second interlayer insulating layer 67 may be disposed between the first etch-stop layer 65 and the second etch-stop layer 75.

The second conductive structure 74 may include a second contact structure 71 and second conductive wirings 73. The second contact structure 71 and the second conductive wirings 73 may be respectively disposed on the second interlayer insulating layer 67. The second contact structure 71 may pass through portions of the first etch-stop layer 65 and the second interlayer insulating layer 67. The second conductive wirings 73 may be disposed on the second contact structure 71, and may pass through the portion of the second interlayer insulating layer 67. In example embodiments, the second conductive wirings 73 may have an integrated structure with the second contact structure 71. For example, the second conductive wirings 73 and the second contact structure 71 may be formed by a single charging process to form the second conductive structure 74, an integrated structure. The second conductive wiring may be referred to as a "second interconnection line". The second contact structure may be referred to as a "second contact plug" or a "second single plug".

The second contact structure 71 and the second conductive wirings 73 may be formed of the same material. In example embodiments, the second contact structure 71 and the second conductive wirings 73 may be formed of a material having low diffusivity. For example, the second contact structure 71 and the second conductive wirings 73 may be formed of ruthenium (Ru), molybdenum (Mo), or a combination thereof. The second contact structure 71 and the second conductive wirings 73 formed of the above-described material may prevent diffusion between conductive structures, and enable fine scaling.

Referring to FIGS. 1 and 3 together, the third structure ST3 may further include a second barrier layer BM2. The second barrier layer BM2 may surround a portion of a surface of the second conductive structure 74. In example embodiments, the second barrier layer BM2 may include a first barrier portion BM21 surrounding a bottom surface of the second contact structure 71, a second barrier portion BM22 surrounding a side surface of the second contact structure 71, a third barrier portion BM23 surrounding bottom surfaces of the second conductive wirings 73, and a fourth barrier portion BM24 surrounding portions of side surfaces of the second conductive wirings 73. The first barrier portion BM21 may be interposed between the bottom surface of the second contact structure 71 and top surfaces of the first conductive wirings 63. The second barrier portion BM22 may be interposed between the side surface of the second contact structure 71 and the second interlayer insulating layer 67. The third barrier portion BM23 may be interposed between the bottom surfaces of the second conductive wirings 73 and the second interlayer insulating layer 67. The fourth barrier portion BM24 may be interposed between the side surfaces of the second conductive wirings 73 and the second interlayer insulating layer 67. The first barrier portion BM21 may contact the top surfaces of the first conductive wirings 63.

The second etch-stop layer 75 may cover top surfaces of the second interlayer insulating layer 67 and the second conductive wirings 73. The second etch-stop layer 75 may include second extension portions EP2 extending between the side surfaces of the second conductive wirings 73 and the second interlayer insulating layer 67. The second extension portions EP2 may surround portions of the side surfaces of the second conductive wirings 73.

The second air gap AG2 may be interposed between the fourth barrier portion BM24 of the second barrier layer BM2 and the second extension portions EP2 of the second etch-stop layer 75. The second air gap AG2 may be defined by the fourth barrier portion BM24 of the second barrier layer BM2, the second extension portions EP2 of the second etch-stop layer 75, the second conductive wirings 73 of the second conductive structure 74, and a second interlayer insulating layer 67. The second air gap AG2 may surround the portions of the side surfaces of the second conductive wirings 73. The semiconductor device 1 may include the second air gap AG2 to reduce resistance and parasitic capacitance between the second conductive wirings 73.

The fourth structure ST4 may be disposed on the third structure ST3. The fourth structure ST4 may include a third interlayer insulating layer 77, a third conductive structure 84 passing through the third interlayer insulating layer 77, a third barrier layer BM3 and a third air gap AG3 surrounding the third conductive structure 84, and a third etch-stop layer 85 having third extension portions EP3.

The third interlayer insulating layer 77, a third contact structure 81, a third conductive wiring 83, the third conductive structure 84, the third etch-stop layer 85, the third extension portions EP3, the third air gap AG3, and the third barrier layer BM3 of the fourth structure ST4 may have features the same as or similar to those of the second interlayer insulating layer 67, the second contact structure 71, the second conductive wirings 73, the second conductive structure 74, the second etch-stop layer 75, the second extension portions EP2, the second air gap AG2, and the second barrier layer BM2 of the third structure ST3 described above, respectively. The third conductive wiring may be referred to as a "third interconnection line". The third contact structure may be referred to as a "third contact plug" or a "third single plug". A description of the fourth structure ST4 overlapping that of the third structure ST3 will be omitted.

FIG. 1 illustrates an example embodiment in which the semiconductor device 1 includes two intermediate wiring structures of the third and fourth structures ST3 and ST4, but is not limited thereto. The semiconductor device 1 may include a single intermediate wiring structure or three or more intermediate wiring structures.

The fifth structure ST5 may be disposed on the fourth structure ST4. The fifth structure ST5 may include a fourth interlayer insulating layer 97 disposed on the third etch-stop layer 85, a fourth conductive structure 94 passing through the third etch-stop layer 85 and the fourth interlayer insulating layer 97, a fourth barrier layer BM4 surrounding a bottom surface and a side surface of the fourth conductive structure 94, and a pad 99 electrically connected to the fourth conductive structure 94.

FIGS. 4, 5, 6, 7 and 8 are cross-sectional views of a semiconductor device according to example embodiments. FIGS. 4 to 8 illustrate partial enlarged views corresponding to region "B" of FIG. 1.

In the example embodiments of FIGS. 4 to 8, the same reference numerals as those of FIGS. 1 to 3 indicated corresponding components, and a description overlapping with the above description will be omitted. In the example embodiments of FIGS. 4 to 8, components indicated by different letters despite having the same reference numerals as those of FIGS. 1 to 3 are for describing an example embodiment different from those of FIGS. 1 to 3, and components having the same reference numerals may have features the same as or similar to the above-described features.

Figure 4:
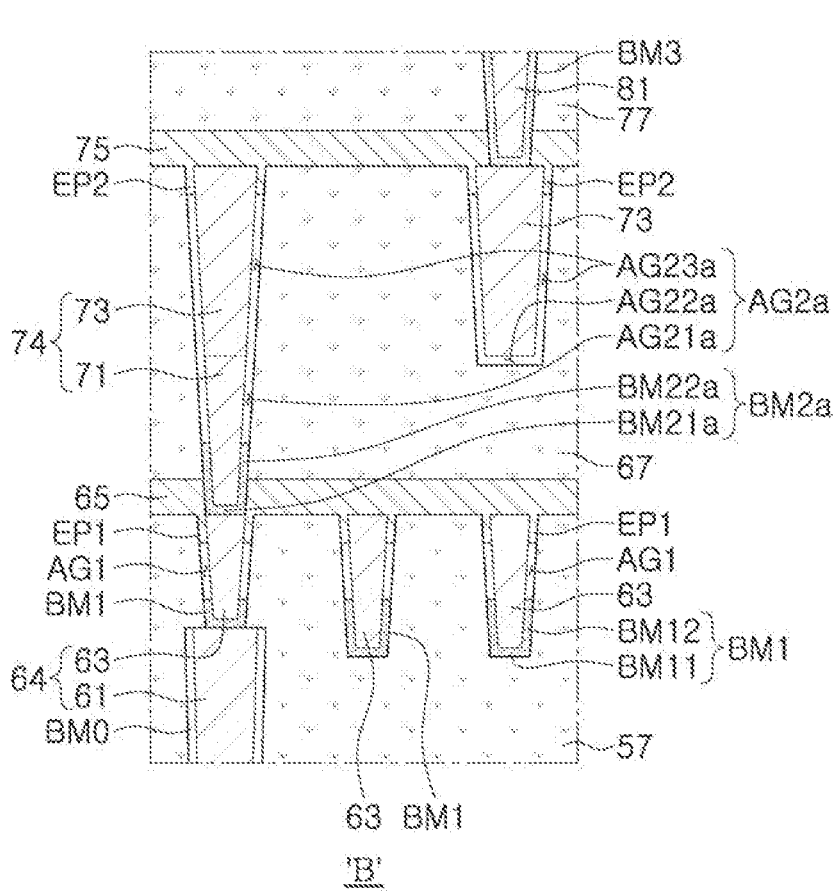
FIG. 4 is a cross-sectional view of a semiconductor device according to example embodiments.

Referring to FIG. 4, a semiconductor device 1a may be different from those in the example embodiments of FIGS. 1 to 3, in terms of shapes of a second barrier layer BM2a and a second air gap AG2a.

The second barrier layer BM2a may surround a portion of a surface of the second conductive structure 74. The second barrier layer BM2a may include a first barrier portion BM21a surrounding a bottom surface of the second contact structure 71 and a second barrier portion BM22a surrounding a portion of a side surface of the second contact structure 71. The first barrier portion BM21a may be interposed between the bottom surface of the second contact structure 71 and top surfaces of the first conductive wirings 63. The second barrier portion BM22a may include a portion interposed between side surfaces of the second conductive wirings 73 and the second interlayer insulating layer 67.

The second air gap AG2a may be interposed between the second barrier portion BM22a of the second barrier layer BM2a and the second extension portions EP2 of the second etch-stop layer 75. The second air gap AG2 may be defined by the second barrier portion BM22a of the second barrier layer BM2, the second extension portions EP2 of the second etch-stop layer 75, the second conductive structure 74, and the second interlayer insulating layer 67. The second air gap AG2a may include a first gap portion AG21a covering at least a portion of the side surface of the second contact structure 71, a second gap portion AG22a covering bottom surfaces of the second conductive wirings 73, and a third gap portion AG23a covering portions of the side surfaces of the second conductive wirings 73.

Figure 5:
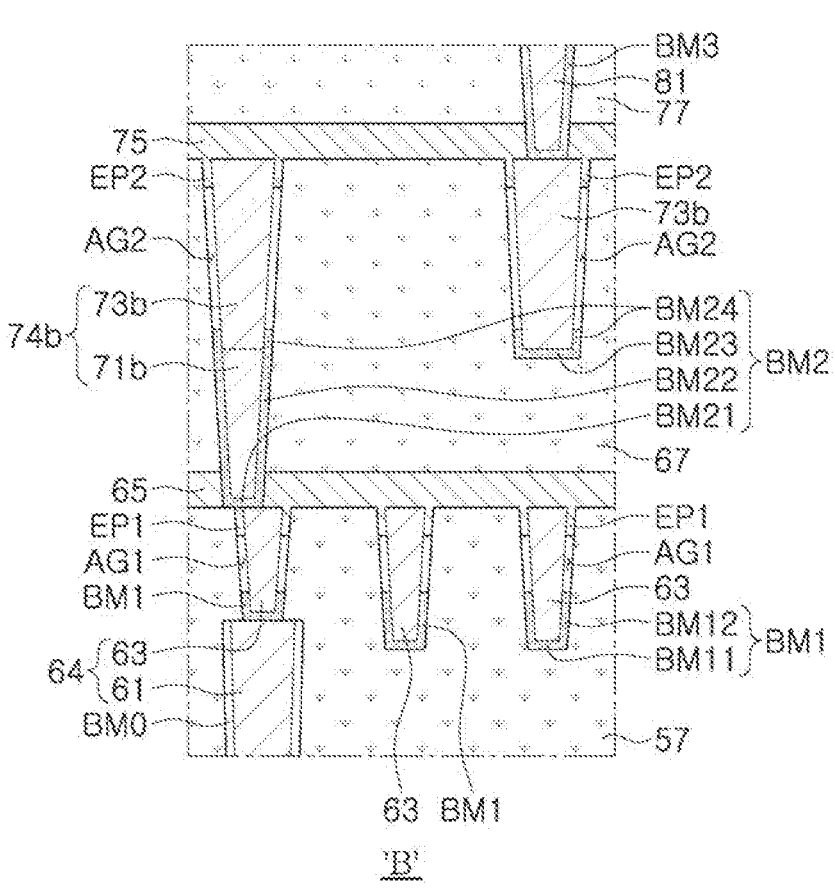
FIG. 5 is a cross-sectional view of a semiconductor device according to example embodiments.

Referring to FIG. 5, the semiconductor device 1b may be different from those in the example embodiments of FIGS. 1 to 3, in terms of a position in which the second conductive structure 74b is disposed with respect to the first conductive wirings 63.

A bottom surface of the second contact structure 71b of the second conductive structure 74b may overlap top surfaces of the first conductive wirings 63 in a vertical direction in some regions. The bottom surface of the second contact structure 71b may include portions respectively overlapping the first interlayer insulating layer 57 and the first air gap AG1 in a vertical direction. At least a portion of a bottom surface of the first barrier portion BM21 of the second barrier layer BM2 may contact the top surfaces of the first conductive wirings 63.

The first conductive wirings 63 may include the first extension portions EP1 defining an upper portion of the first air gap AG1, thereby preventing the first air gap AG1 from being filled by introduction of the first barrier portion BM21 of the second barrier layer BM2 into the first air gap AG1.

Figure 6:
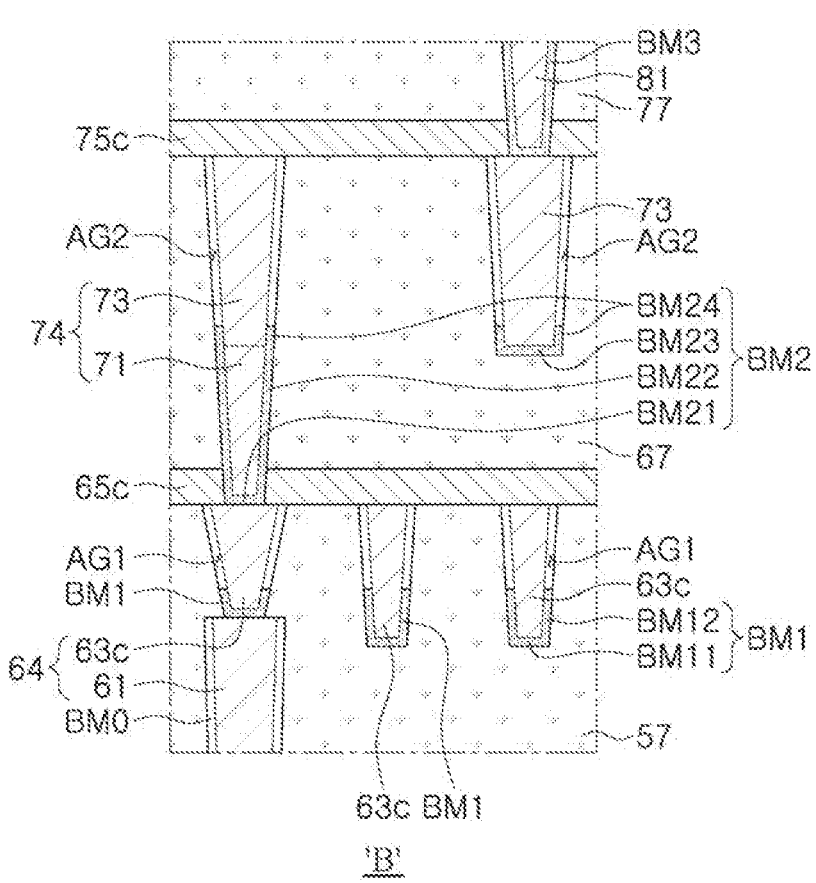
FIG. 6 is a cross-sectional view of a semiconductor device according to example embodiments.

Referring to FIG. 6, a semiconductor device 1c may be different from those in the example embodiments of FIGS. 1 to 3, in terms of the shapes of first and second etch-stop layers 65c and 75c and a shape of a first conductive wiring 63c.

The first etch-stop layer 65c may cover top surfaces of the first conductive wiring 63c and the first interlayer insulating layer 57, and may not include an extension portion extending along a side surface of the first conductive wiring 63c. The second etch-stop layer 75c may cover top surfaces of the second conductive wirings 73 and the second interlayer insulating layer 67, and may not include an extension portion extending along the side surfaces of the second conductive wirings 73. For example, the first etch-stop layer 65c and the second etch-stop layer 75c may have a substantially flat lower surface.

The top surface of the first conductive wiring 63c may have a larger region than those of a bottom surface of the first contact structure 61 and the bottom surface of the first barrier portion BM21 of the second barrier layer BM2. The entire region of the bottom surface of the first barrier portion BM21 of the second barrier layer BM2 may contact the top surface of the first conductive wiring 63c. The first conductive wiring 63c may have the above-described shape, thereby preventing the first air gap AG1 from being filled by introduction of the second barrier layer BM2 into the first air gap AG1, even when the first etch-stop layer 65c does not include the extension portion extending along the side surface of the first conductive wiring 63c.

Figure 7:
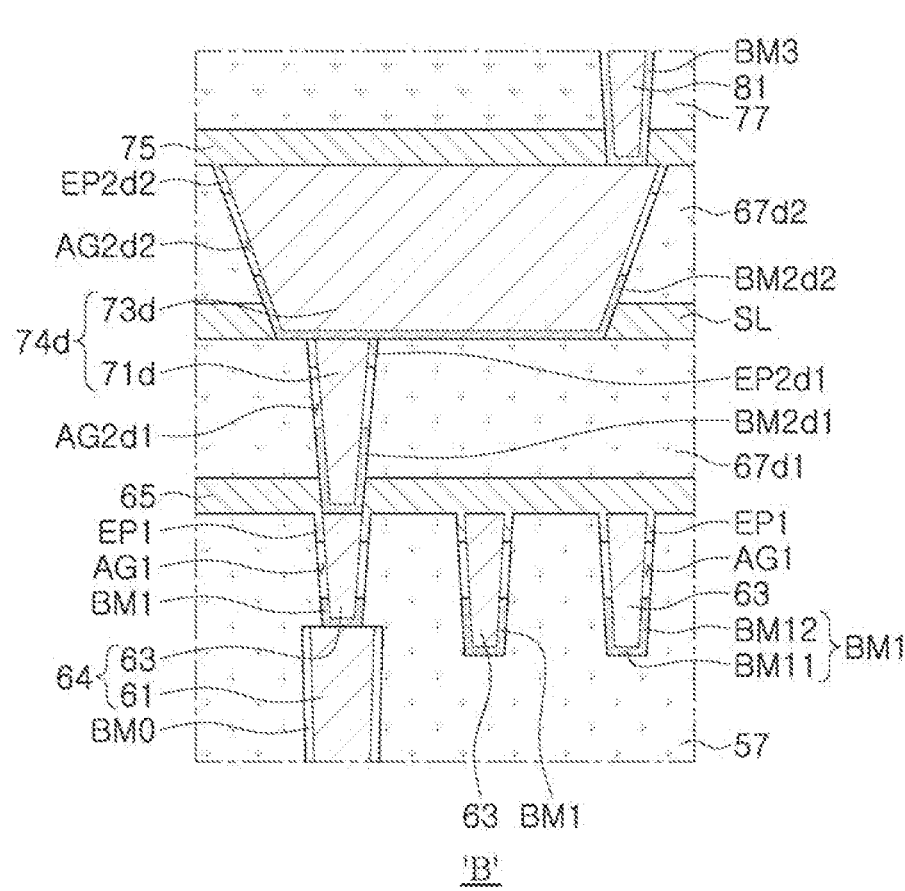
FIG. 7 is a cross-sectional view of a semiconductor device according to example embodiments.

Referring to FIG. 7, a semiconductor device 1d may be different from those in the example embodiments of FIGS. 1 to 3 in that a second contact structure 71d and a second conductive wiring 73d are respectively formed by a single damascene process.

The semiconductor device 1d may include a first etch-stop layer 65, a second lower interlayer insulating layer 67d1, an intermediate etch-stop layer SL, a second upper interlayer insulating layer 67d2, and a second etch-stop layer 75 sequentially disposed from below.

The second contact structure 71d may be disposed to pass through the first etch-stop layer 65 and the second lower interlayer insulating layer 67d1. A second lower barrier layer BM2d1 may surround portions of a bottom surface and a side surface of the second contact structure 71d. Second lower extension portions EP2d1 extending from the intermediate etch-stop layer SL may surround a portion of an upper portion of the side surface of the second contact structure 71d. A second lower air gap AG2d1 may be defined by the second lower extension portions EP2d1, the second lower barrier layer BM2d1, the second contact structure 71d, and the second lower interlayer insulating layer 67d1.

The second conductive wiring 73d may be disposed on the second contact structure 71d to be electrically connected to the second contact structure 71d. The second conductive wiring 73d may be disposed to pass through the intermediate etch-stop layer SL and the second upper interlayer insulating layer 67d2. A second upper barrier layer BM2d2 may surround portions of a bottom surface and a side surface of the second conductive wiring 73d. Second upper extension portions EP2d2 extending from the second etch-stop layer 75 may surround a portion of an upper portion of the side surface of the second conductive wiring 73d. A second upper air gap AG2d2 may be defined by the second upper extension portions EP2d2, the second upper barrier layer BM2d2, the second conductive wiring 73d, and the second upper interlayer insulating layer 67d2.

The second contact structure 71d and the second conductive wiring 73d disposed on the second contact structure 71d may form a second conductive structure 74d.

Figure 8:
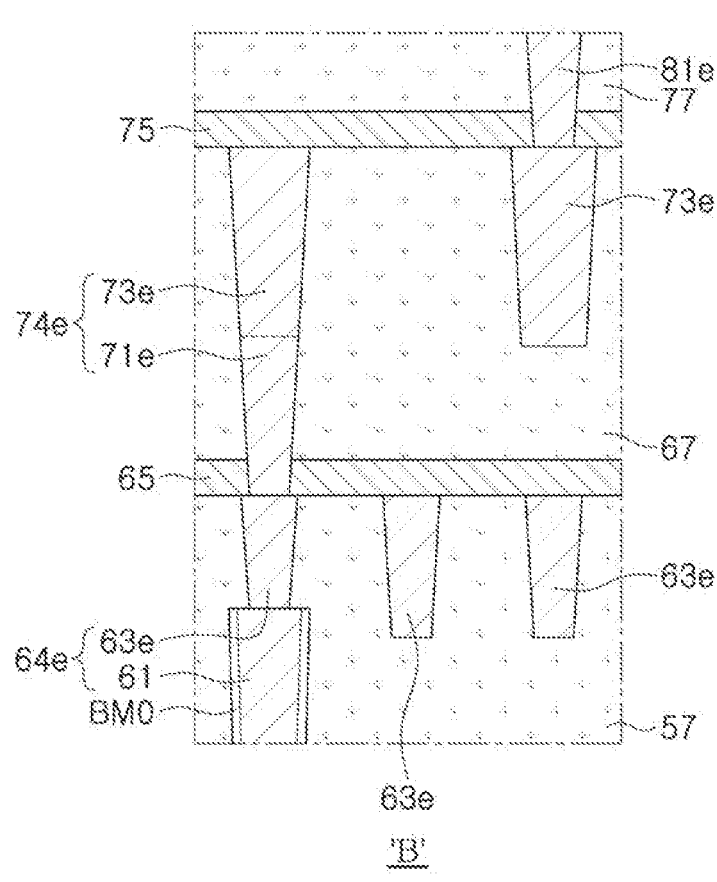
FIG. 8 is a cross-sectional view of a semiconductor device according to example embodiments.

Referring to FIG. 8, a semiconductor device 1e may be different from those in the example embodiments of FIGS. 1 to 3 in that first conductive wirings 63e, a second conductive structure 74e, and a third contact structure 81e directly contact a first interlayer insulating layer 57, a second interlayer insulating layer 67, and a third interlayer insulating layer 77, respectively.

Each of the first conductive wirings 63e, the second conductive structure 74e, and the third conductive wiring 83e may be formed of a material having low diffusivity. The third conductive wiring may be referred to as a "third interconnection line." In example embodiments, each of the first conductive wirings 63e, the second conductive structure 74e, and the third conductive wiring 83e may be formed of at least one of ruthenium (Ru) or molybdenum (Mo). Materials of conductive wirings may have low diffusivity, such that diffusion between the conductive wirings may be prevented. Thus, an air gap and a barrier layer may be omitted. The second conductive structure 74e may include a second contact structure 71e and second conductive wirings 73e. The first contact structure 61 and the first conductive wirings 63e may form a first conductive structure 64e.

In addition, the semiconductor device 1e may also be different from those in the example embodiments of FIGS. 1 to 3 in that first and second etch-stop layers 65e and 75e do not include extension portions extending on side surfaces of the conductive wirings.

Figure 9:
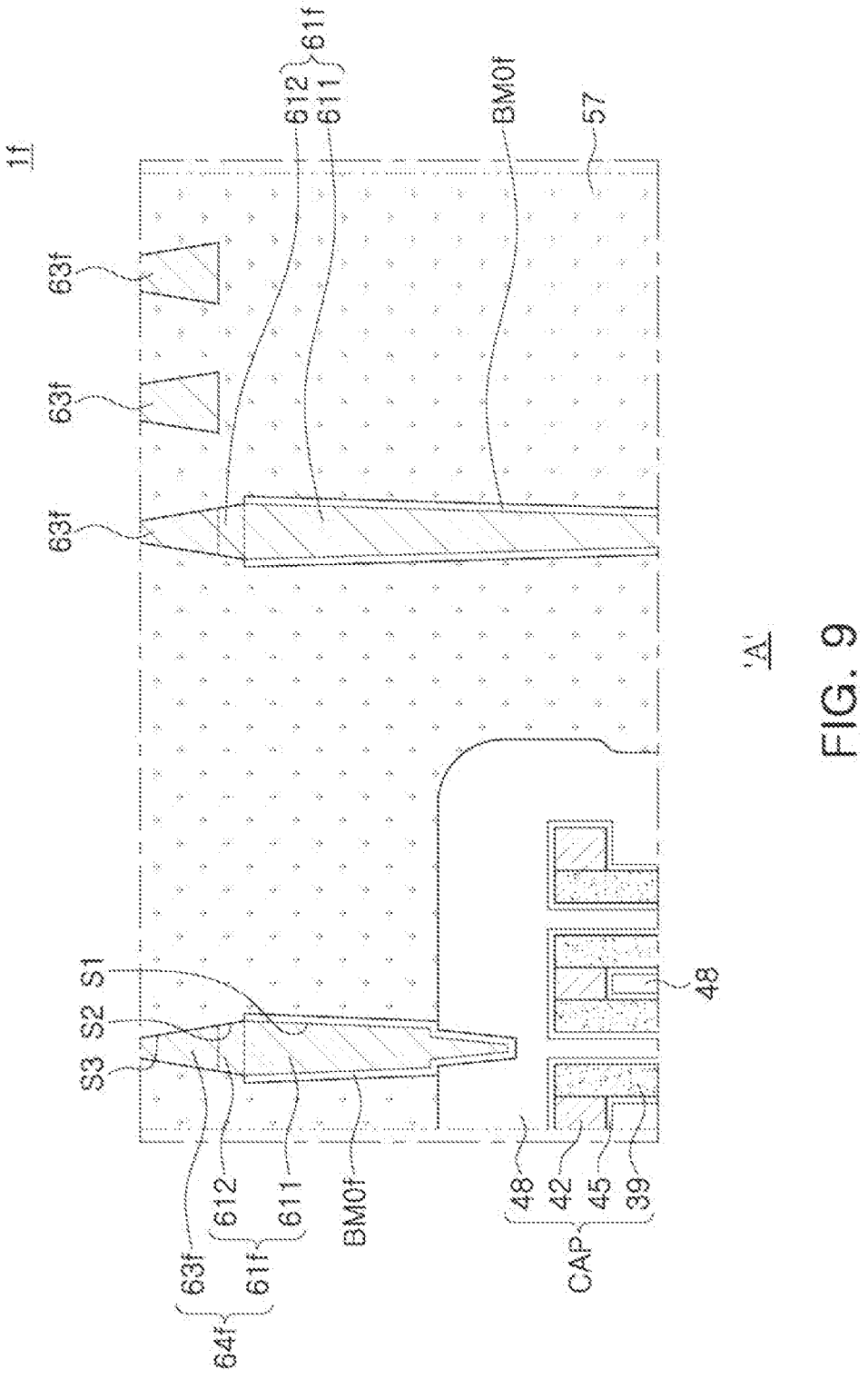
FIG. 9 is a cross-sectional view of a semiconductor device according to example embodiments.

FIG. 9 is a cross-sectional view of a semiconductor device according to example embodiments. FIG. 9 is a partially enlarged view illustrating a portion corresponding to region "A" of FIG. 1. In the example embodiment of FIG. 9, the same reference numerals as those of FIGS. 1 to 3 indicated corresponding components, and a description overlapping with the above description will be omitted. In the example embodiment of FIG. 9, components indicated by different letters despite having the same reference numerals as those of FIGS. 1 to 3 are for describing an example embodiment different from those of FIGS. 1 to 3, and components having the same reference numerals may have features the same as or similar to the above-described features.

Referring to FIG. 9, a semiconductor device if may be different from those in the example embodiments of FIGS. 1 to 3 in that a first conductive structure 64*f* has an integrated structure.

A first contact structure 61*f* and a first conductive wiring 63*f* may be integrally formed to form the first conductive structure 64*f*. In example embodiments, the first contact structure 61*f* and the first conductive wiring 63*f* may form the first conductive structure 64*f* having an integrated structure formed by a single filling process. The first contact structure 61*f* and the first conductive wiring 63*f* may be formed of the same material. The first conductive structure 64*f* may be formed of a material having low diffusivity. In example embodiments, the first conductive structure 64*f* may be formed of ruthenium (Ru), molybdenum (Mo), or a combination thereof.

The first contact structure 61*f* may include a lower portion 611 and an upper portion 612. The lower portion 611 may have a first side surface S1 having a first inclination. The upper portion 612 may have a second side surface S2 having a second inclination. The second inclination may be different from the first inclination. In example embodiments, the first inclination and the second inclination may be opposite in positive and negative perspectives. For example, the upper portion 612 may include a portion having a width gradually decreasing in an upward direction, and the lower portion 611 may include a portion having a width gradually decreasing in a downward direction.

A contact bather layer BM0*f* may surround a portion of a surface of the first contact structure 61*f*. In example embodiments, the contact barrier layer BM0*f* may surround a side surface and a bottom surface of the lower portion 611, and may not surround a side surface of the upper portion 612. The upper portion 612 may directly contact the first interlayer insulating layer 57.

The first conductive wiring 63*f* may be integrally formed with the first contact structure 61*f* on the first contact structure 61*f*. The first conductive wiring 63*f* may have a third side surface S3. A third side surface S3 of the first conductive wiring 63*f* may include a portion aligned with the second side surface S2 of the upper portion 612 of the first contact structure 61*f*. The third side surface S3 may have an inclination the same as the second inclination of the second side surface S2. The first conductive wiring 63*f* may include a portion having a width gradually decreasing in an upward direction. The first conductive wiring 63*f* may directly contact the first interlayer insulating layer 57.

FIGS. 10A, 10B, 10C, 10D, 10E, 10F, 10G, 10H and 10I are cross-sectional views illustrating a method of manufacturing a semiconductor device according to example embodiments. FIGS. 10A to 10I illustrate a step-by-step process of manufacturing the semiconductor device 1 of FIGS. 1 to 3, and illustrate partially enlarged views corresponding to region "B" of FIG. 1.

First, referring to FIGS. 1 to 3, the isolation region 9 defining the cell active regions 6*c* and the peripheral active region 6*p* may be formed on the substrate 3 including the first region A1 and the second region A2. An ion implantation process may be performed using the isolation region 9 as an ion implantation mask to form the cell impurity regions 12*c* on upper portions of the cell active regions 6*c* and form the peripheral impurity region 12*p* on an upper portion of the peripheral active region 6*p*.

Thereafter, the bit line structures 30 may be formed on the first region A1 of the substrate 3. Forming the bit line structures 30 may include forming the bit lines 21 and the bit line capping layers 24 sequentially stacked, and forming the bit line spacers 27 on side surfaces of the bit lines 21 and the bit line capping layers 24 sequentially stacked.

The bit lines 21 may be formed on the first lower insulating layer 15 on the substrate 3. The bit line capping layers 24 may be formed of an insulating material such as silicon nitride or the like. The bit line spacers 27 may be formed of an insulating material such as silicon nitride. The second lower insulating layer 18 may be formed on the second region A2 of the substrate 3. The second lower insulating layer 18 may be formed of silicon oxide. The cell contact plugs 33*c*, disposed between the bit line structures 30 and electrically connected to the cell impurity regions 12*c* in the cell active regions 6*c*, may be formed. The peripheral contact plug 33*p*, passing through the second lower insulating layer 18 and electrically connected to the peripheral impurity region 12*p* in the peripheral active region 6*p*, may be formed. Accordingly, the first structure ST1 may be formed.

The data storage structure CAP may be formed on the substrate 3 including the cell contact plugs 33*c* and the peripheral contact plug 33*p*. Forming the data storage structure CAP may include forming the conductive patterns 39 on the cell contact plugs 33*c*, forming the support patterns 42 connecting the conductive patterns 39 to each other, conformally forming the dielectric layer 45 covering the conductive patterns 39 and the support patterns 42, and forming the electrode layer 48 covering the conductive patterns 39 and the support patterns 42 on the dielectric layer 45.

On the substrate 3, the first interlayer insulating layer 57, covering the data storage structure CAP, may be formed, and the first contact structures 61, passing through the first interlayer insulating layer 57 and electrically connected to the data storage structure CAP or the peripheral contact plug 33*p*, may be formed. Prior to forming the first contact structures 61, the contact barrier layer BM0, surrounding side surfaces and bottom surfaces of the first contact structures 61, may be formed.

Figure 10A:
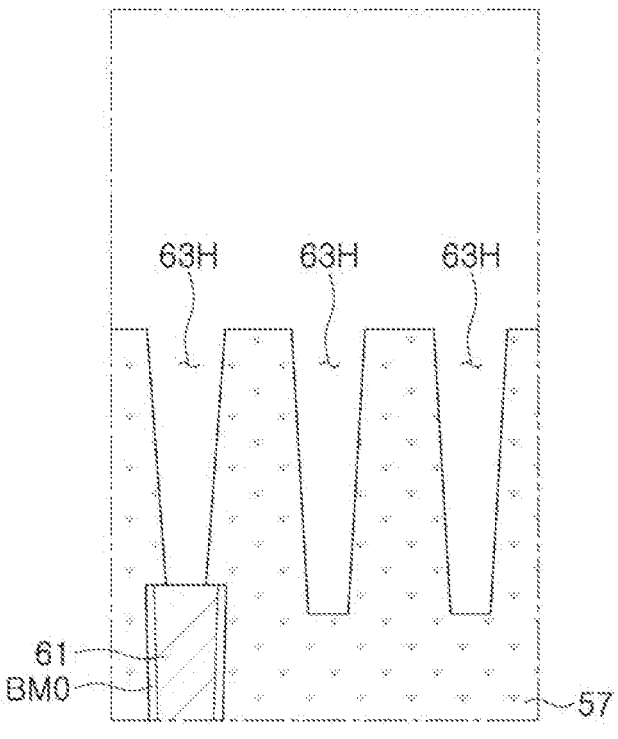
FIGS. 10A, 10B, 10C, 10D, 10E, 10F, 10G, 10H and 10I are cross-sectional views illustrating a process of manufacturing a semiconductor device according to example embodiments.

Referring to FIG. 10A, the first interlayer insulating layer 57 may be patterned to form first conductive wiring holes 63H. The first conductive wiring holes 63H may expose at least portions of top surfaces of the first contact structures 61.

Figure 10B:
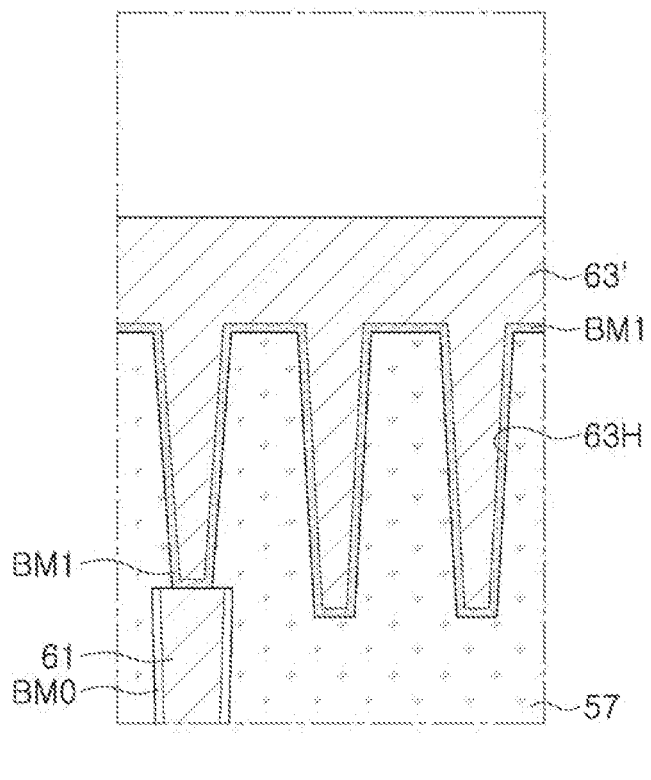

Referring to FIG. 10B, the first barrier layer BM1 may be conformally formed along a top surface of the first interlayer insulating layer 57, surfaces of the first conductive wiring holes 63H, and an exposed top surface of the first contact structure 61. Thereafter, a first metal layer 63', covering the first barrier layer BM1, may be formed. The first metal layer 63' may be formed of a material having low diffusivity. In example embodiments, the first conductive wirings 63 may be formed of ruthenium (Ru), molybdenum (Mo), or a combination thereof.

Figure 10C:
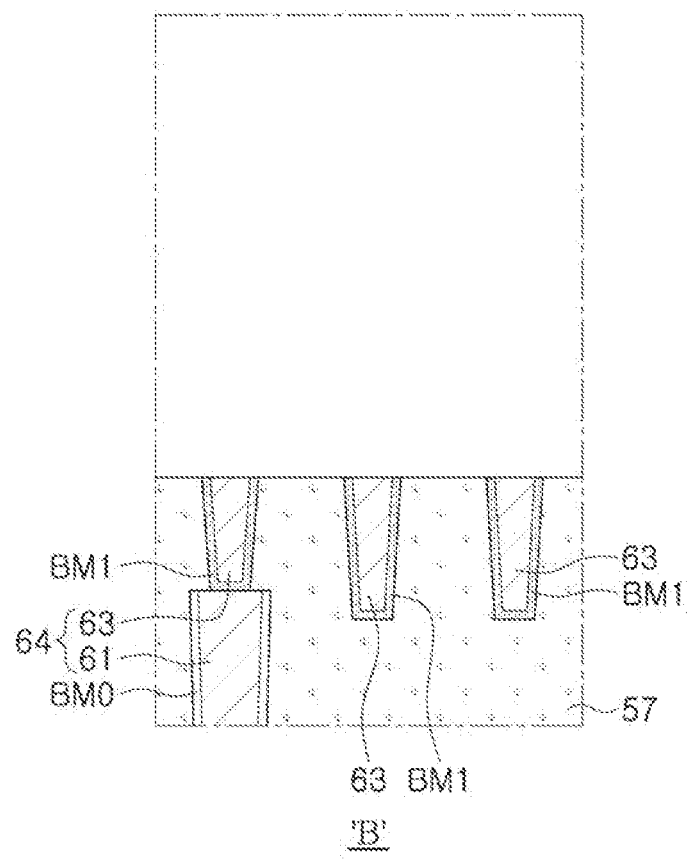

Referring to FIG. 10C, portions of the first metal layer (63' of FIG. 10B), the first barrier layer BM1, and the first interlayer insulating layer 57 may be removed. Accordingly, the first conductive wirings 63, having a bottom surface and a side surface surrounded by the first barrier layer BM1, may be formed. In example embodiments, the first conductive wirings 63, the first barrier layer BM1, and the first interlayer insulating layer 57 may be planarized by a reactive ion etching (RIE) process. Metals (for example, ruthenium (Ru), molybdenum (Mo), or a combination thereof) forming the first conductive wirings 63 may be planarized by an etchback process using RIE, such that a loss caused by etching may be reduced, thereby alleviating a burden on the process. The first conductive wirings 63 may form the first conductive structure 64 together with the first contact structure 61.

Figure 10D:
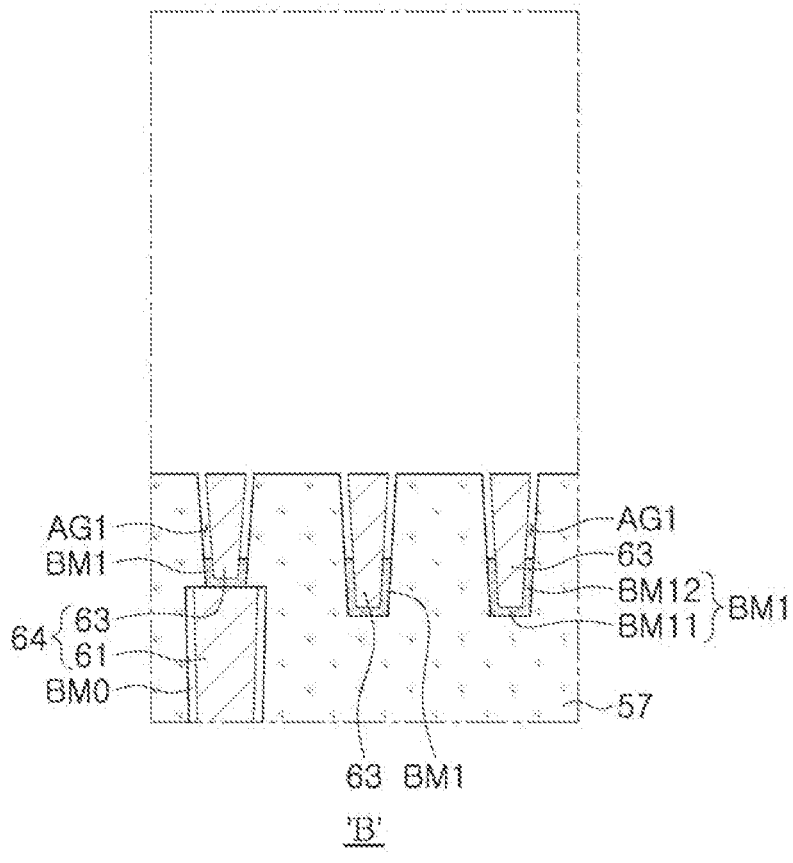

Referring to FIG. 10D, a portion of an upper portion of the first barrier layer BM1, surrounding side surfaces of the first conductive wirings 63, may be removed. Accordingly, the first barrier layer BM1 may include the first barrier portion BM11 surrounding bottom surfaces of the first conductive wirings 63, and the second barrier portion BM12 surrounding portions of the side surfaces of the first conductive wirings 63. In example embodiments, the first barrier layer BM1 may be patterned by a wet etching process. With respect to an etchant used in the wet etching process, the first conductive wirings 63 may have an etching rate lower than that of the first barrier layer BM1. Accordingly, the first barrier layer BM1 may be selectively patterned. The first air gap AG1 may be formed in a region from which a portion of the first barrier layer BM1 is removed.

Figure 10E:
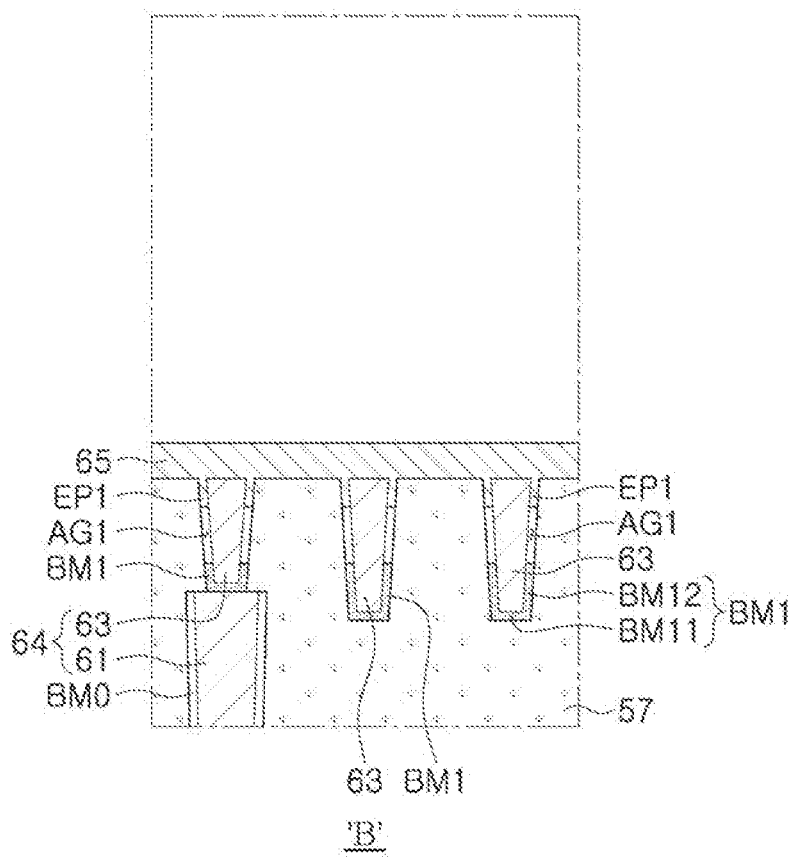

Referring to FIG. 10E, a first etch-stop layer 65, covering top surfaces of the first interlayer insulating layer 57 and the first conductive wirings 63, may be formed. The first etch-stop layer 65 may include the first extension portions EP1 extending between side surfaces of the first conductive wirings 63 and the first interlayer insulating layer 57. Accordingly, the first air gap AG1 may be defined by the first interlayer insulating layer 57, the first conductive wirings 63, the first extension portions EP1, and the first barrier layer BM1. The first extension portions EP1 may be interposed between the side surfaces of the first conductive wirings 63 and the first interlayer insulating layer 57 to surround portions of the side surfaces of the first conductive wirings 63. Accordingly, the second structure (ST2 of FIG. 1) may be formed.

Figure 10F:
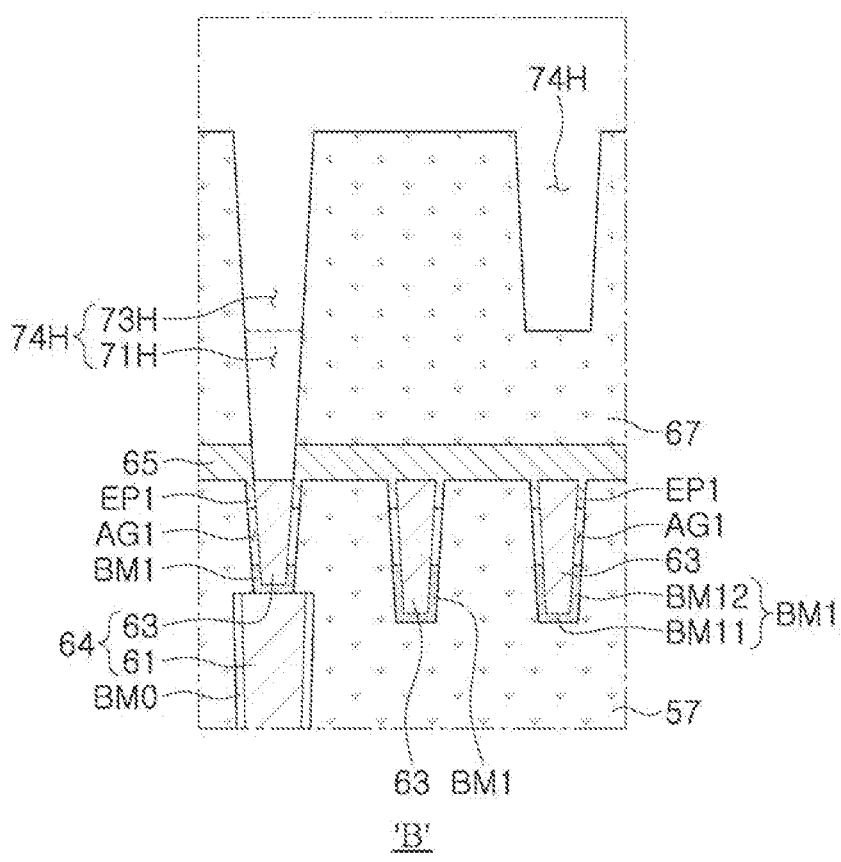

Referring to FIG. 10F, after forming the second interlayer insulating layer 67 on the first etch-stop layer 65, the first etch-stop layer 65 and the second interlayer insulating layer 67 may be patterned. By the patterning, second conductive structure holes 74H, passing through the first etch-stop layer 65 and the second interlayer insulating layer 67, may be formed. At least portions of top surfaces of the first conductive wirings 63 may be exposed by the second conductive structure holes 74H.

The second conductive structure holes 74H may include a second contact structure hole 71H and a second conductive wiring hole 73H. Forming the second conductive structure holes 74H may include forming the second contact structure hole 71H passing through portions of the first etch-stop layer 65 and the second interlayer insulating layer 67, and forming the second conductive wiring hole 73H passing through a portion of the second interlayer insulating layer 67 on the second contact structure hole 71H.

Figure 10G:
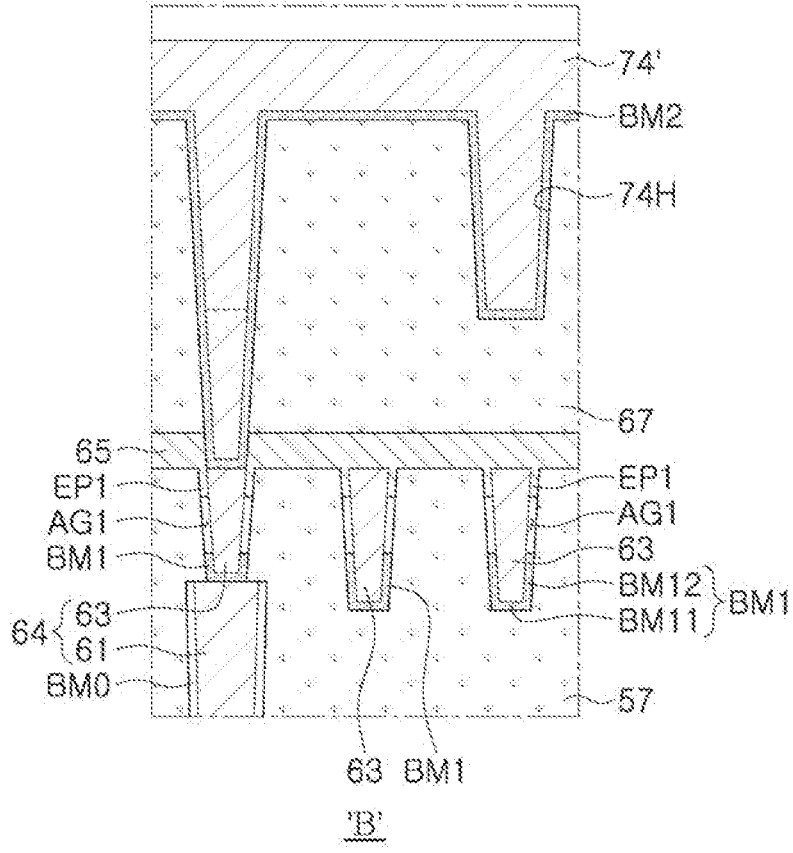

Referring to FIG. 10G, the second bather layer BM2 may be conformally formed along a top surface of the second interlayer insulating layer 67, surfaces of the second conductive structure holes 74H, and exposed top surfaces of the first conductive wirings 63. Thereafter, a second conductive film 74', covering the second barrier layer BM2, may be formed. The second conductive film 74' may be formed of a material having low diffusivity. In example embodiments, the second conductive film 74' may be formed of ruthenium (Ru), molybdenum (Mo), or a combination thereof.

Figure 10H:
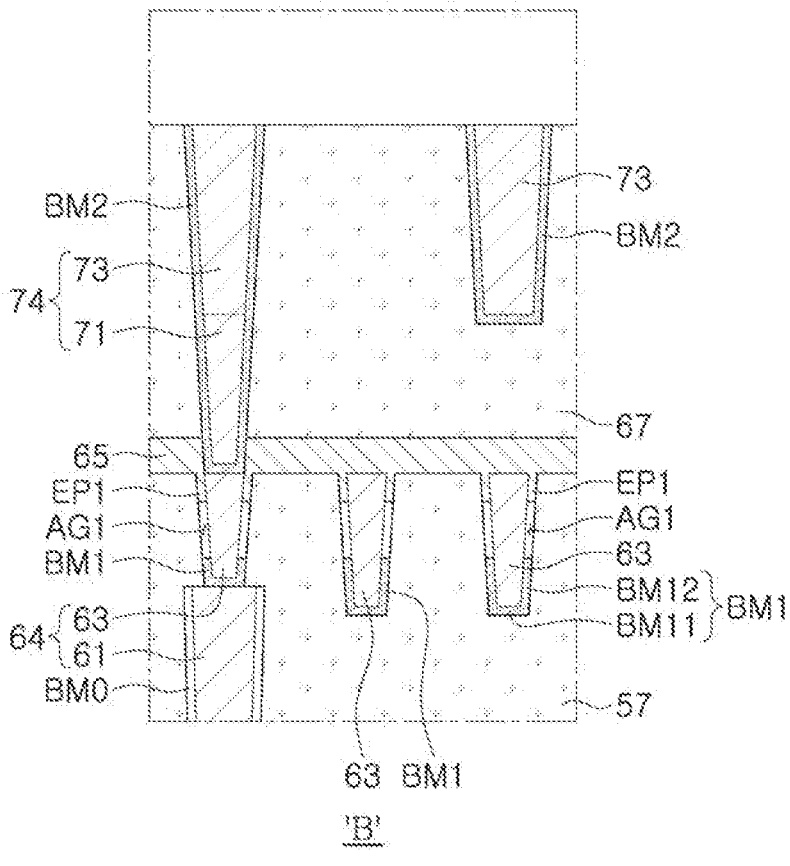

Referring to FIG. 10H, portions of the second conductive film (74' of FIG. the second barrier layer BM2, and the second interlayer insulating layer 67 may be removed. Accordingly, the second conductive structure 74, having a surface except for a top surface surrounded by the second barrier layer BM2, may be formed. The second conductive structure 74 may include the second contact structure 71 connected to the first conductive wirings 63, and the second conductive wirings 73 disposed on the second contact structure 71. The second contact structure 71 and the second conductive wirings 73 may have an integrated structure formed by the same filling process.

In example embodiments, the second conductive structure 74, the second barrier layer BM2, and the second interlayer insulating layer 67 may be etched by an RIE process. Metals (for example, ruthenium (Ru), molybdenum (Mo), or a combination thereof) forming the second conductive structure 74 may be planarized by an etchback process using RIE, such that a loss caused by etching may be reduced, thereby alleviating a burden on the process.

Figure 10I:
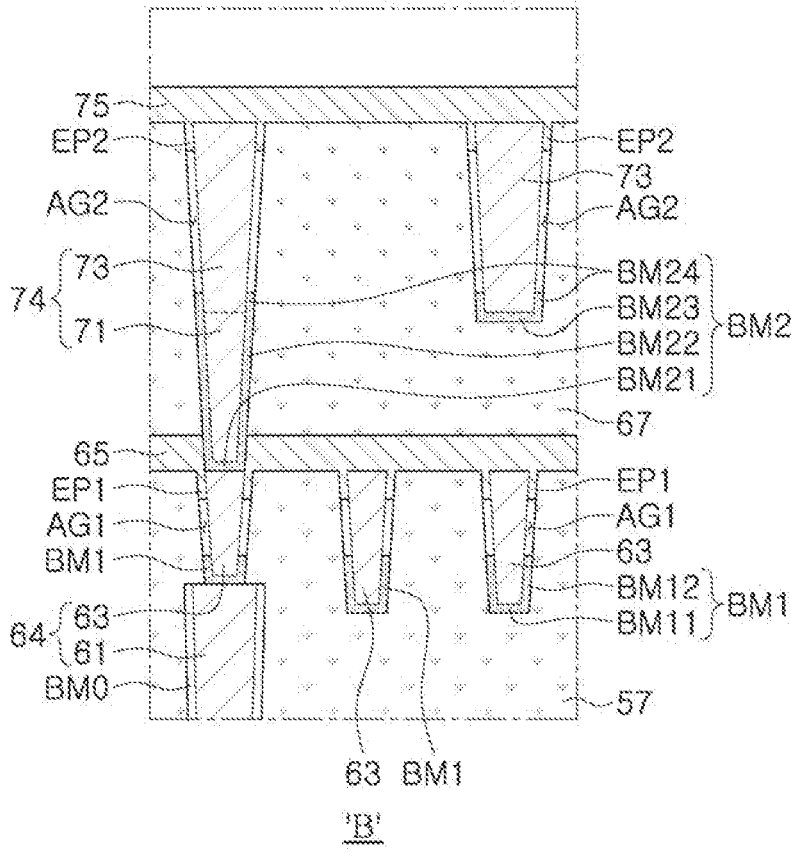

Referring to FIG. 10I, a portion of an upper portion of the second barrier layer BM2, surrounding a side surface of the second conductive structure 74, may be removed. In example embodiments, the second bather layer BM2 may include the first bather portion BM21 surrounding a bottom surface of the second contact structure 71, the second bather portion BM22 surrounding a side surface of the second contact structure 71, the third bather portion BM23 surrounding bottom surfaces of the second conductive wirings 73, and the fourth barrier portion BM24 surrounding portions of side surfaces of the second conductive wirings 73.

Thereafter, the second etch-stop layer 75, covering top surfaces of the second interlayer insulating layer 67 and the second conductive structure 74, may be formed. The second etch-stop layer 75 may include the second extension portions EP2 extending between side surfaces of the second conductive wirings 73 and the second insulating layer 67. The second air gap AG2 may be defined by the second interlayer insulating layer 67, the second conductive structure 74, the second extension portions EP2, and the second bather layer BM2. The second extension portions EP2 may be interposed between the second conductive wirings 73 and the second interlayer insulating layer 67 to surround portions of the side surfaces of the second conductive wirings 73. The third structure (ST3 of FIG. 1) may be formed by the above-described manufacturing processes of FIGS. 10F to 10I.

However, the shapes of the second bather layer BM2 and the second air gap AG2 are not limited to the above-described shapes. In other example embodiments, for example, referring to FIG. 4, the second barrier layer BM2a may be etched to a level lower than those of the second conductive wirings 73, such that the second barrier layer BM2a may include the first barrier portion BM21a surrounding a bottom surface of the second contact structure 71 and a second bather portion BM22a surrounding a portion of a side surface of the second contact structure 71. The air gap AG2a may surround the portions of the side surfaces of the second conductive wirings 73 and the portion of the side surface of the second contact structure 71.

Thereafter, referring back to FIG. 1, the fourth structure ST4 may be formed on the third structure ST3. A method of forming the fourth structure ST4 may be the same as or similar to the method of forming the third structure ST3 described with reference to FIGS. 10F to 10I. Thereafter, the fifth structure ST5 may be formed on the fourth structure ST4. Forming the fifth structure ST5 may include forming the fourth interlayer insulating layer 97, forming the fourth conductive structure 94 passing through the fourth interlayer insulating layer 97, forming the fourth bather layer BM4 surrounding a side surface and a bottom surface of the fourth conductive structure 94, and forming the pad 99 connected to the fourth conductive structure 94. Accordingly, the semiconductor device 1 illustrated in FIG. 1 may be formed.

Figure 11A:
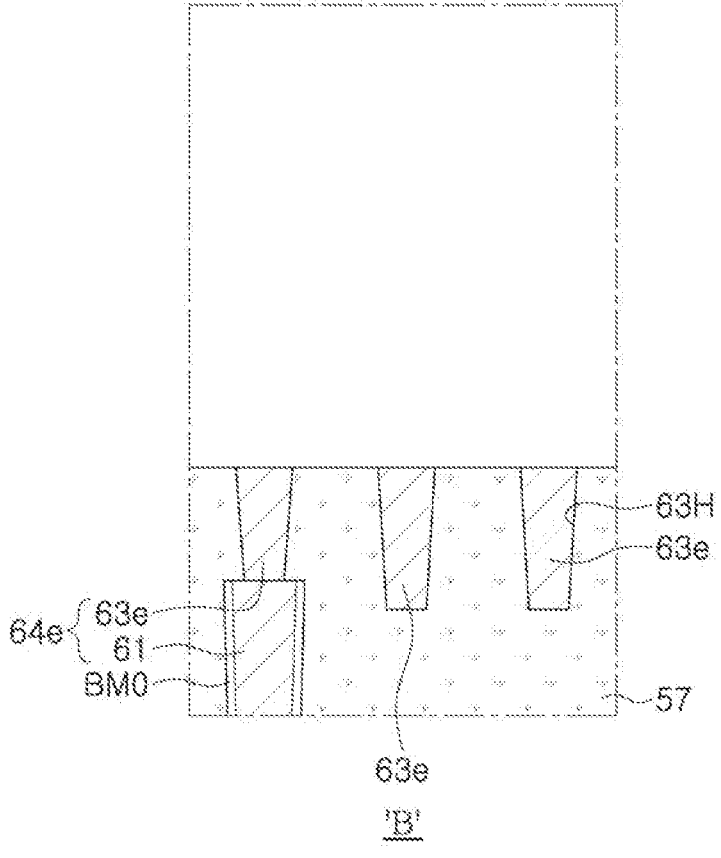
FIGS. 11A, 11B and 11C are cross-sectional views illustrating a process of manufacturing a semiconductor device according to example embodiments.
Figure 11B:
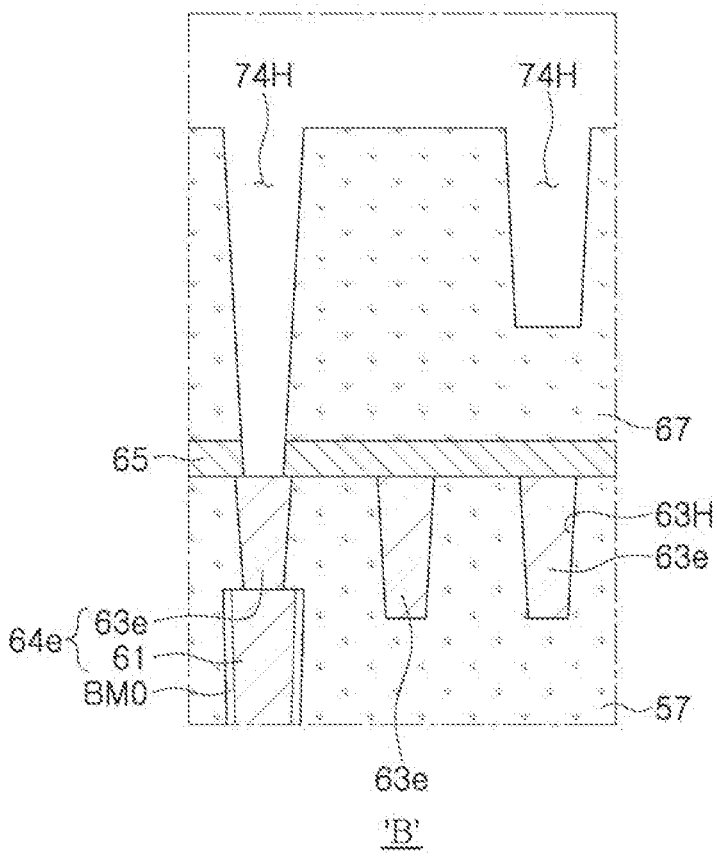
Figure 11C:
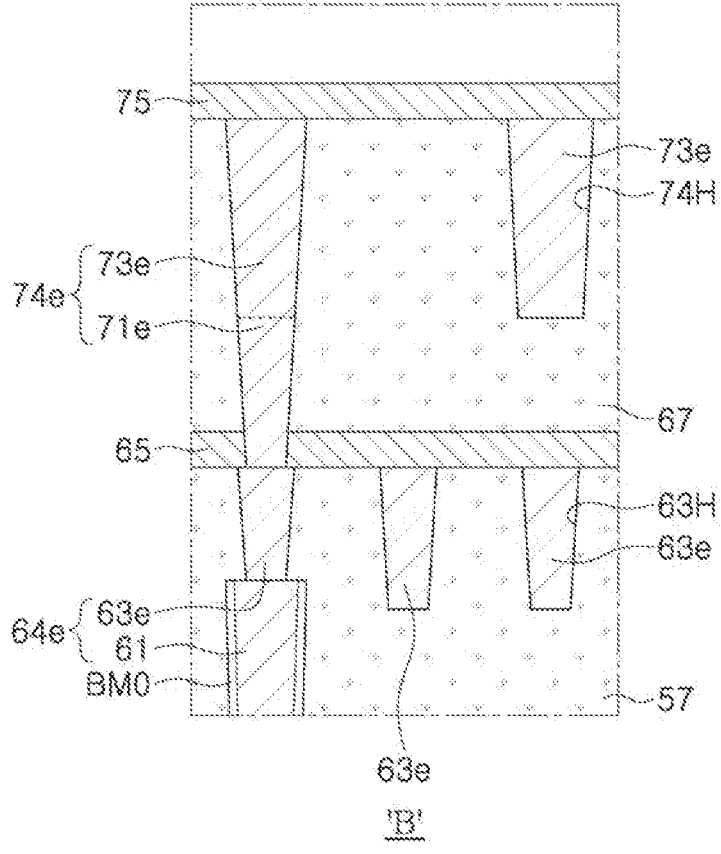

FIGS. 11A, 11B and 11C are cross-sectional views illustrating a method of manufacturing a semiconductor device according to example embodiments. FIGS. 11A to 11C illustrate a process of manufacturing the semiconductor device 1e of FIG. 8, and illustrate a portion corresponding to region "B" of FIG. 1.

Prior to performing the processes of FIGS. 11A to 11C, the above-described processes up until the process of FIG. 10A may be applied in the same manner. The processes of FIGS. 10B to 10I may be replaced with the processes of FIGS. 11A to 11C. In FIGS. 11A to 11C below, descriptions overlapping with the descriptions of FIGS. 10B to 10I will be omitted.

Referring to FIG. 11A, the first conductive wirings 63e, filling the first conductive wiring holes 63H, may be formed. Forming the first conductive wirings 63e may include forming a first metal layer filling the first conductive wiring holes 63H and covering the first interlayer insulating layer 57, and etching portions of the first metal layer and the first interlayer insulating layer 57 by a reactive ion process. The first conductive wirings 63e may directly contact the first interlayer insulating layer 57. The first conductive wirings 63e and the first contact structure 61 may form the first conductive structure 64e.

Referring to FIG. 11B, the first etch-stop layer 65 and the second interlayer insulating layer 67 may be sequentially stacked on top surfaces of the first interlayer insulating layer 57 and the first conductive wirings 63e. Thereafter, the first etch-stop layer 65 and the second interlayer insulating layer 67 may be patterned to form the second conductive structure holes 74H exposing at least portions of the top surfaces of the first conductive wirings 63e. Forming the second conductive structure holes 74H may include forming the second contact structure hole 71H passing through portions of the first etch-stop layer 65 and the second interlayer insulating layer 67, and forming the second conductive wiring hole 73H passing through a portion of the second interlayer insulating layer 67 on the second contact structure hole 71H.

Referring to FIG. 11C, the second conductive structure 74e, including the second contact structure 71e and the second conductive wirings 73e, may be formed in the second conductive structure holes 74H. Forming the second conductive structure 74e may include forming a conductive film filling the second conductive structure holes 74H and covering the second interlayer insulating layer 67, and etching back portions of the conductive film and the second interlayer insulating layer 67 by a reactive ion process. Thereafter, the second etch-stop layer 75, covering top surfaces of the second interlayer insulating layer 67 and the second conductive structure 74e, may be formed. A lower surface of the second etch-stop layer 75 may have a substantially flat shape. Accordingly, the semiconductor device 1e illustrated in FIG. 8 may be manufactured.

Figure 12A:
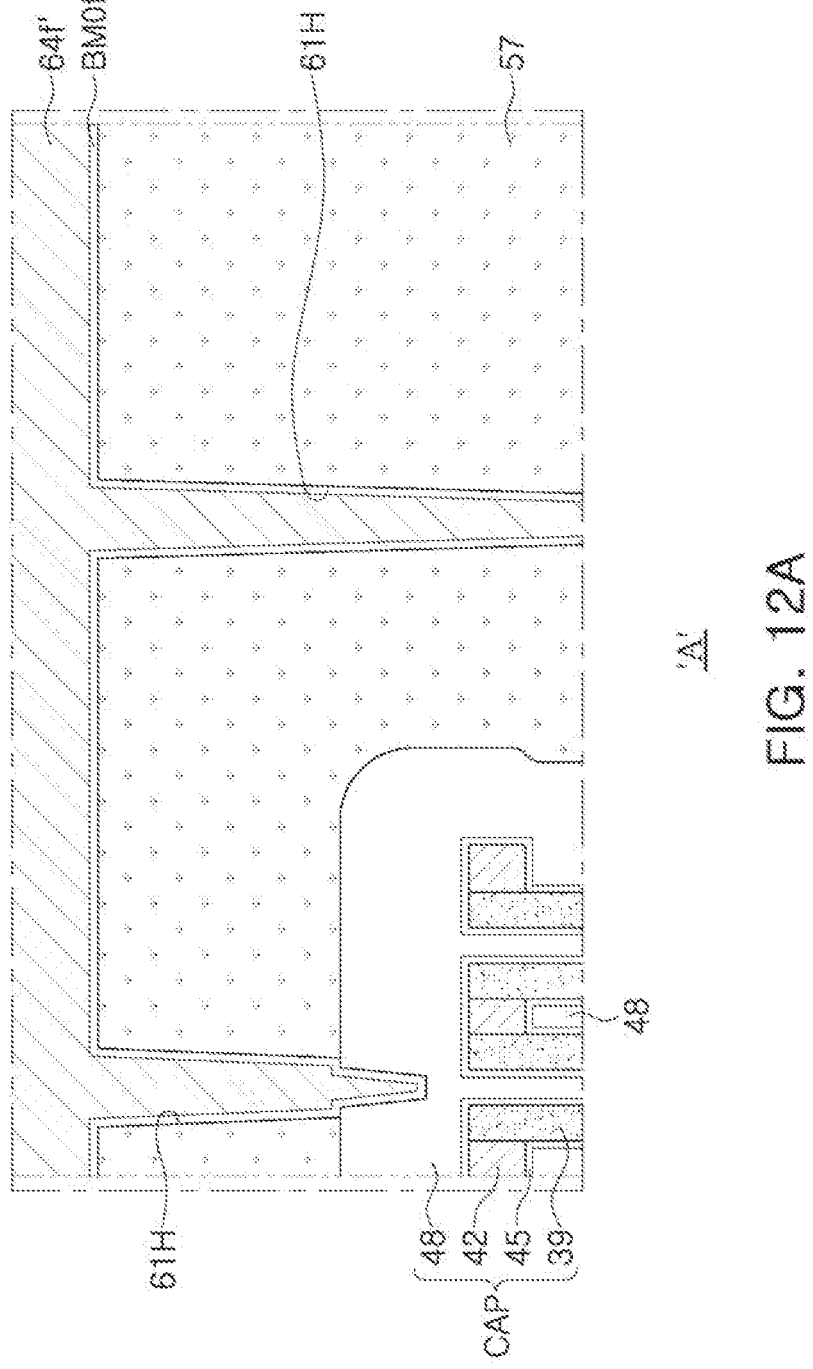
FIGS. 12A and 12B are cross-sectional views illustrating a process of manufacturing a semiconductor device according to example embodiments.
Figure 12B:
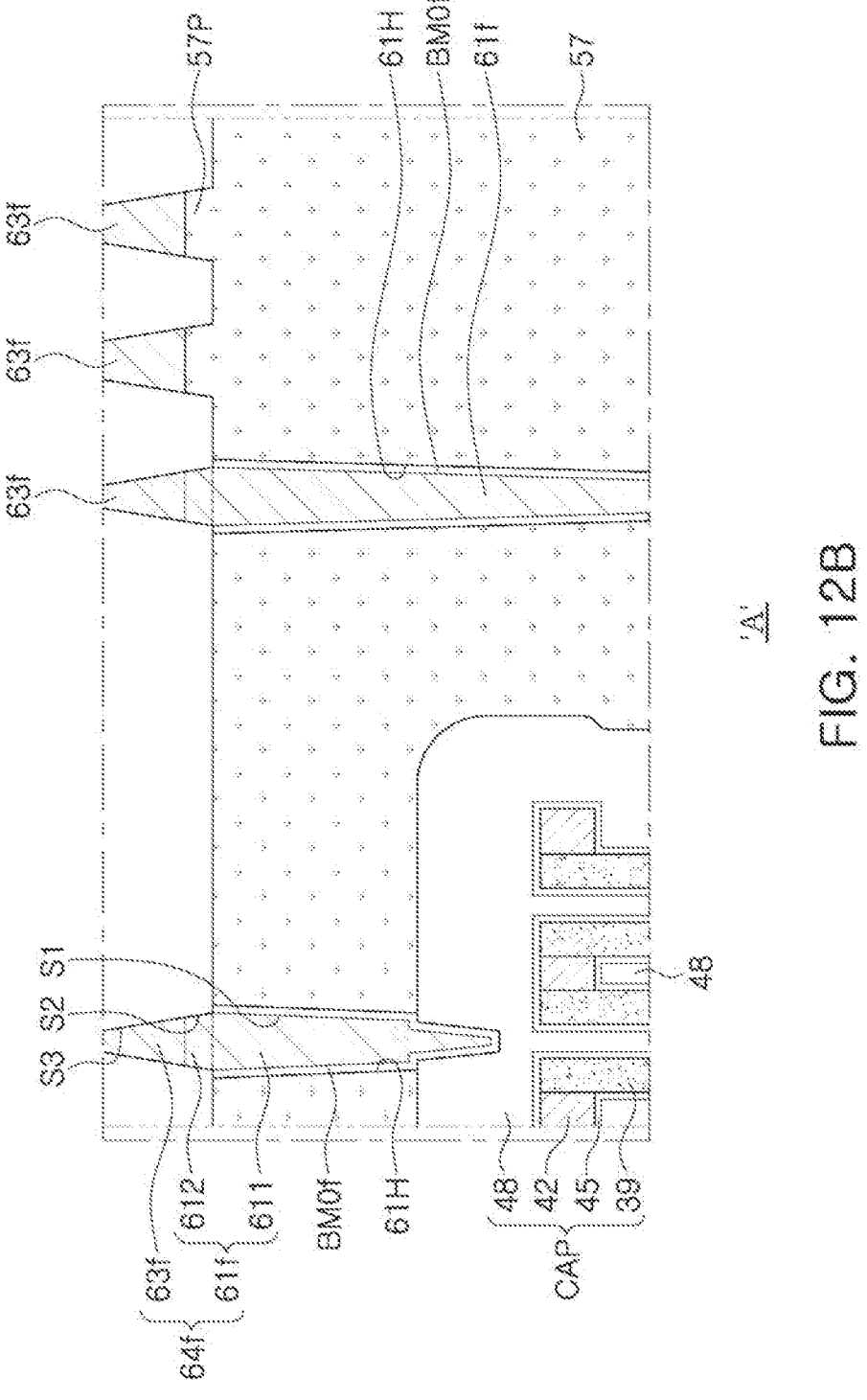

FIGS. 12A and 12B are cross-sectional views illustrating a process of manufacturing a semiconductor device according to example embodiments. FIGS. 12A and 12B illustrate a step-by-step process of manufacturing the semiconductor device 1f of FIG. 9, and illustrate a portion corresponding to region "A" of FIG. 1.

Referring to FIG. 12A, first contact structure holes 61H, passing through the first interlayer insulating layer 57, may be formed. The first contact structure holes 61H may be formed by etching the first interlayer insulating layer 57 in an engraving manner. The first contact structure holes 61H may have a shape having a width gradually decreasing in a downward direction. The first contact structure holes 61H may be connected to the data storage structure CAP in the first region (A1 of FIG. 1) of the substrate (3 of FIG. 1), or may be connected to the peripheral contact plug (33p of FIG. 1) in the second region (A2 of FIG. 1) of the substrate (3 of FIG. 1).

The contact barrier layer BM0 may be conformally formed along a top surface of the first interlayer insulating layer 57, surfaces of the first contact structure holes 61H, and surfaces of devices exposed by the first contact structure holes 61H. Thereafter, a first conductive film 64f, filling the first contact structure holes 61H and covering the contact bather layer BM0, may be formed. The first conductive film 64f may be formed of a material having low diffusivity. In example embodiments, the first conductive film 64f may be formed of ruthenium (Ru), molybdenum (Mo), or a combination thereof.

Referring to FIG. 12B, the first conductive structure 64f may be formed by etching portions of the first conductive film (64f of FIG. 12A) and the first interlayer insulating layer 57 in an embossing manner. At substantially the same time, a portion of the contact barrier layer BM0 may be removed.

The first conductive structure 64f may include the first contact structure 61f and the first conductive wiring 63f, and the first contact structure 61f may include the lower portion 611 and the upper portion 612. The first conductive structure 64f may be an integrated structure of the first contact structure 61f and the first conductive wiring 63f. The lower portion 611 of the first contact structure 61f may have a shape having a width gradually decreasing in a downward direction. The upper portion 612 of the first contact structure 61f and the first conductive wiring 63f may be etched in an embossing manner to have a shape having a width gradually decreasing in an upward direction. The first interlayer insulating layer 57 may include protrusions 57P in some regions contacting the first conductive wirings 57f.

The lower portion 611 of the first contact structure 61f may include the first side surface S1 having a first inclination, and the upper portion 612 of the first contact structure 61f may include the second side surface S2 having a second inclination. The first conductive wiring 63f may include the third side surface S3 having a second inclination, the third side surface S3 including a portion aligned with the second side surface S2. The contact barrier layer BM0 may surround the first side surface S1 of the lower portion 611 of the first contact structure 61E The second side surface S2 of the upper portion 612 of the first contact structure 61f and the third side surface S3 of the first conductive wiring 63f may be exposed.

The first contact structure 61f and the first conductive wiring 63f may be formed by the same filling process to form the single first conductive structure 64f. The first contact structure 61f and the first conductive wiring 63f may be integrally formed, thereby increasing process efficiency.

Referring back to FIG. 9, an insulating material may be additionally formed to cover a side surface of the first contact structure 61f and a side surface of the first conductive wiring 63f. Accordingly, the first interlayer insulating layer 57, substantially coplanar with a top surface of the first conductive structure 64, may be formed. A boundary between insulating layers in the first interlayer insulating layer 57 may not be identified. Forming the first interlayer insulating layer 57 may include forming an insulating layer covering a side surface and a top surface of the first conductive structure 64, and planarizing the first conductive structure 64 and the insulating layer. Thereafter, a first etch-stop layer, covering top surfaces of the first conductive structure 64 and the first interlayer insulating layer 57, may be formed to form a structure corresponding to the second structure ST2 of FIG. 1.

According to example embodiments, a conductive structure may be formed of a material having low diffusivity, and a portion of a barrier layer surrounding a surface of the conductive structure may be removed, thereby reducing resistance and parasitic capacitance between conductive wirings, and increasing a degree of freedom of a process.

According to example embodiments, a conductive structure may be formed of a material such as ruthenium (Ru) or molybdenum (Mo) having low diffusivity, such that a barrier layer may be partially or entirely removed. A space from which the barrier layer is removed may form an air gap. In addition, ruthenium (Ru) and molybdenum (Mo) may be planarized by an etch-back process using reactive ion etching, thereby alleviating a burden on the process.

The various and beneficial advantages and effects of example embodiments are not limited to the above description, and will be more easily understood in the course of describing specific example embodiments.

While example embodiments have been shown and described above, it will be apparent to those skilled in the art that modifications and variations could be made without departing from the scope of example embodiments as defined by the appended claims.

What is claimed is:

1. A semiconductor device comprising:
   a lower structure;
   a first contact structure connected to the lower structure;
   a first conductive wiring connected to the first contact structure;
   a first etch-stop layer and an interlayer insulating layer sequentially provided on the first conductive wiring;
   a second contact structure passing through the first etch-stop layer, provided in the interlayer insulating layer, and connected to the first conductive wiring;
   a second conductive wiring provided on the second contact structure and provided in the interlayer insulating layer;
   a barrier layer comprising a first barrier portion provided on a bottom surface of the second contact structure;
   a second etch-stop layer on a top surface of the second conductive wiring and a top surface of the interlayer insulating layer, the second etch-stop layer comprising an extension portion extending toward the barrier layer and extending between the second conductive wiring and the interlayer insulating layer such that the extension portion is provided on an upper portion of a side surface of the second conductive wiring; and
   an air gap between the barrier layer and the extension portion.

2. The semiconductor device of claim 1, wherein the barrier layer extends such that the barrier layer is provided on at least a portion of a side surface of the second contact structure.

3. The semiconductor device of claim 1, wherein the second contact structure and the second conductive wiring form a conductive structure, and
   wherein the air gap is defined by the conductive structure, the interlayer insulating layer, the extension portion, and the barrier layer.

4. The semiconductor device of claim 1, wherein the barrier layer further comprises:
   a second barrier portion covering a side surface of the second contact structure, a third barrier portion covering a bottom surface of the second conductive wiring, and
   a fourth barrier portion covering a portion of the side surface of the second conductive wiring.

5. The semiconductor device of claim 1, wherein the air gap comprises:
   a first gap portion covering a side surface of the second contact structure,
   a second gap portion covering a bottom surface of the second conductive wiring, and
   a third gap portion covering a portion of the side surface of the second conductive wiring.

6. The semiconductor device of claim 1, wherein at least a portion of a bottom surface of the barrier layer contacts a top surface of the first conductive wiring.

7. The semiconductor device of claim 1, wherein the second contact structure and the second conductive wiring have an integrated structure.

8. The semiconductor device of claim 1, wherein the top surface of the second conductive wiring and the top surface of the interlayer insulating layer are substantially coplanar.

9. The semiconductor device of claim 1, wherein the second contact structure and the second conductive wiring comprise at least one of ruthenium (Ru) and molybdenum (Mo).

10. The semiconductor device of claim 1, wherein the lower structure comprises a cell switching device, a bit line, and a cell capacitor, and
   wherein the first conductive wiring, the second contact structure, and the second conductive wiring are at a level higher than a level than the cell capacitor.

11. The semiconductor device of claim 1, wherein the first contact structure and the first conductive wiring have an integrated structure.

12. The semiconductor device of claim 11, wherein the integrated structure of the first contact structure and the first conductive wiring comprises at least one of ruthenium (Ru) or molybdenum (Mo).

13. A semiconductor device comprising:
   a first conductive wiring;
   a contact structure connected to the first conductive wiring, the contact structure comprising at least one of ruthenium (Ru) or molybdenum (Mo);
   a second conductive wiring connected to the contact structure, the second conductive wiring comprising at least one of ruthenium (Ru) or molybdenum (Mo);
   an interlayer insulating layer surrounding a side surface of the contact structure and a side surface of the second conductive wiring;
   a barrier layer comprising:
      a first barrier portion provided between a bottom surface of the contact structure and a top surface of the first conductive wiring, and
      a second barrier portion provided between a side surface of the contact structure and the interlayer insulating layer;
   an etch-stop layer provided on a top surface of the interlayer insulating layer and a top surface of the second conductive wiring, the etch-stop layer comprising an extension portion extending toward the barrier layer and provided between the side surface of the second conductive wiring and the interlayer insulating layer; and
   an air gap between the second barrier portion of the barrier layer and the extension portion of the etch-stop layer.

14. The semiconductor device of claim 13, wherein the second barrier portion of the barrier layer entirely covers the side surface of the contact structure, and wherein the barrier layer further comprises:

a third barrier portion extending from the second barrier portion such that the third barrier portion is provided on a bottom surface of the second conductive wiring, and a fourth barrier portion extending from the third barrier portion such that the fourth barrier portion is provided on a first portion of the side surface of the second conductive wiring.

15. The semiconductor device of claim 14, wherein the air gap covers a second portion of the side surface of the second conductive wiring.

16. The semiconductor device of claim 13, wherein the second barrier portion of the barrier layer is provided on a first portion of the side surface of the contact structure.

17. The semiconductor device of claim 16, wherein the air gap comprises:

a first gap portion covering a second portion of the side surface of the contact structure, a second gap portion covering a bottom surface of the second conductive wiring, and a third gap portion covering a portion of the side surface of the second conductive wiring.

18. A semiconductor device comprising:

a lower structure;

a contact structure connected to the lower structure, the contact structure comprising:

a lower portion comprising a first side surface having a first inclination, and an upper portion comprising a second side surface having a second inclination different from the first inclination;

a conductive wiring provided on the contact structure and having a structure integrated with the contact structure, the conductive wiring comprising a third side surface aligned with the second side surface of the contact structure and having a third inclination that is the same as the second inclination; and a barrier layer provided on at least the first side surface of the lower portion of the contact structure, wherein the first side surface of the lower portion contacts the second side surface of the upper portion.

19. The semiconductor device of claim 18, wherein the lower portion of the contact structure has a gradually decreasing width in a downward direction, and wherein the upper portion of the contact structure and the conductive wiring have a gradually decreasing width in an upward direction.

20. The semiconductor device of claim 18, wherein the contact structure and the conductive wiring are formed of a same first material, and wherein the first material comprises at least one of ruthenium (Ru) or molybdenum (Mo).

* * * * *